(12) United States Patent
Kim et al.

(10) Patent No.: US 12,355,011 B2
(45) Date of Patent: Jul. 8, 2025

(54) MICRO-LIGHT-EMITTING-DIODE ARRAY AND METHOD OF MANUFACTURING THE SAME

(71) Applicant: SAMSUNG ELECTRONICS CO., LTD., Suwon-si (KR)

(72) Inventors: Hyunjoon Kim, Seoul (KR); Kyungwook Hwang, Seoul (KR); Joonyong Park, Suwon-si (KR); Seogwoo Hong, Yongin-si (KR); Junsik Hwang, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 1002 days.

(21) Appl. No.: 17/399,683

(22) Filed: Aug. 11, 2021

(65) Prior Publication Data

US 2022/0139887 A1    May 5, 2022

(30) Foreign Application Priority Data

Nov. 5, 2020 (KR) .......... 10-2020-0147088
Apr. 21, 2021 (KR) .......... 10-2021-0051822

(51) Int. Cl.
*H01L 25/075* (2006.01)
*H10H 20/857* (2025.01)
*H10H 20/01* (2025.01)

(52) U.S. Cl.
CPC ....... *H01L 25/0753* (2013.01); *H10H 20/857* (2025.01); *H10H 20/0364* (2025.01)

(58) Field of Classification Search
CPC ............... H01L 25/0753; H01L 33/62; H01L 2933/0066; H01L 24/29; H01L 24/32; H01L 24/73; H01L 24/83; H01L 24/13; H01L 24/14; H01L 24/17; H01L 24/81
See application file for complete search history.

(56) References Cited

U.S. PATENT DOCUMENTS

| | | | |
|---|---|---|---|
| 5,355,577 A | 10/1994 | Cohn | |
| 7,730,610 B2 | 6/2010 | Nakagawa et al. | |
| 10,418,527 B2 | 9/2019 | Sasaki et al. | |
| 10,520,769 B2 * | 12/2019 | Ulmer | ............... G02F 1/133603 |
| 2001/0031514 A1 | 10/2001 | Smith | |
| 2015/0214430 A1 | 7/2015 | Zhan et al. | |

(Continued)

FOREIGN PATENT DOCUMENTS

| | | |
|---|---|---|
| CN | 108364971 A | 8/2018 |
| KR | 101961834 B1 | 3/2019 |

(Continued)

*Primary Examiner* — Ratisha Mehta
(74) *Attorney, Agent, or Firm* — Sughrue Mion, PLLC

(57) ABSTRACT

A method of manufacturing a micro-light-emitting diode (LED) array includes: providing a first substrate including a plurality of circular grooves formed on a first surface thereof; supplying a plurality of micro-LEDs onto the first surface of the first substrate; and aligning the plurality of micro-LEDs with the plurality of circular grooves, wherein at least two electrodes are formed on a second surface of each of the plurality of micro-LEDs to be apart from each other, and the at least two electrodes include a first electrode formed to be relatively close to a center of the second surface and at least one second electrode formed at an edge of the second surface.

14 Claims, 26 Drawing Sheets

(56) References Cited

U.S. PATENT DOCUMENTS

| | | | |
|---|---|---|---|
| 2016/0336486 A1 | 11/2016 | Lin et al. | |
| 2018/0029038 A1 | 2/2018 | Sasaki et al. | |
| 2018/0219139 A1* | 8/2018 | Sasaki | H01L 33/62 |
| 2019/0006564 A1 | 1/2019 | Sasaki et al. | |
| 2020/0064687 A1* | 2/2020 | Imada | G02F 1/133514 |
| 2020/0209461 A1* | 7/2020 | Achi | G02B 6/0045 |
| 2020/0286870 A1 | 9/2020 | Sasaki et al. | |
| 2021/0005782 A1 | 1/2021 | Ting et al. | |
| 2021/0167177 A1 | 6/2021 | Um et al. | |
| 2021/0408331 A1* | 12/2021 | Liang | H01L 25/167 |
| 2022/0013400 A1 | 1/2022 | Hwang et al. | |
| 2022/0051924 A1 | 2/2022 | Kim et al. | |
| 2022/0077120 A1 | 3/2022 | Hong et al. | |
| 2022/0077346 A1 | 3/2022 | Hwang et al. | |
| 2022/0102602 A1 | 3/2022 | Hwang et al. | |
| 2022/0122953 A1 | 4/2022 | Hwang et al. | |
| 2022/0189810 A1 | 6/2022 | Hwang et al. | |

FOREIGN PATENT DOCUMENTS

| | | |
|---|---|---|
| KR | 1020190104276 A | 9/2019 |
| KR | 1020190111151 A | 10/2019 |
| KR | 1020200019501 A | 2/2020 |
| KR | 10-2022-0007500 A | 1/2022 |

\* cited by examiner

MICRO-LIGHT-EMITTING-DIODE ARRAY AND METHOD OF MANUFACTURING THE SAME

CROSS-REFERENCE TO RELATED APPLICATIONS

This application is based on and claims priority under 35 U.S.C. § 119 to Korean Patent Application No. 10-2020-0147088, filed on Nov. 5, 2020 and Korean Patent Application No. 10-2021-0051822, filed on Apr. 21, 2021, in the Korean Intellectual Property Office, the disclosures of which are incorporated by reference herein in their entireties.

BACKGROUND

1. Field

The present disclosure relates to a micro-light-emitting diode (LED) array and a method of manufacturing the same, and more particularly, to a structure of an electrode on a micro-LED and an electrode on a driving circuit substrate.

2. Description of Related Art

A light-emitting diode (LED) has benefits, such as low power consumption and environmentally friendly characteristics. Due to these benefits, industrial demand for LEDs has increased. An LED may be applied not only to an illumination device or a backlight of a liquid crystal display (LCD), but also to an LED display apparatus. That is, display apparatuses implementing micro-LEDs have been developed. In order to manufacture a micro-LED display apparatus, a micro-LED needs to be transferred onto a substrate. As a method of transferring a micro-LED, a pick and place method is frequently used. However, productivity of this method declines as the size of the micro-LED decreases and the size of a display increases. In addition, to transfer a plurality of micro-LEDs emitting a plurality of colors of light, transfer processes corresponding to the number of colors of light are required, and thus, much time is required for a transferring operation.

Furthermore, as an area of an LED display apparatus increases, an area of a driving circuit substrate onto which micro-LEDs have to be transferred may increase. In order to form a display apparatus having a large area, the number of processes of transferring micro-LEDs may be increased, thereby increasing the time and expenses required to manufacture the display apparatus. Thus, a method of efficiently transferring micro-LEDs onto the driving circuit substrate is required.

As a method of transferring micro-LEDs onto a driving circuit substrate, various wet and dry transfer techniques are known. For example, a wet transfer technique in the related art may transfer a micro-LED onto a desired location of a driving circuit substrate by using the surface tension of a liquid, and using a laminar flow generated via perturbation due to solution pumping, etc. A dry transfer technique in the related art may transfer a micro-LED onto a desired location of a driving circuit substrate by using vibration, etc. of an ultrasonic vibrator or a diaphragm or by using an electric field or a magnetic field, and the like are known. When these variety of wet and dry transfer techniques are used, the plurality of micro-LEDs may be aligned with the plurality of grooves in the mold substrate. Furthermore, micro-LEDs may be directly aligned on a driving circuit substrate including a plurality of grooves, rather than a mold substrate.

When micro-LEDs are aligned with respect to a substrate, shapes of the micro-LEDs and shapes of grooves in the substrate may be formed to be the same. Alternatively, a circular micro-LED may be aligned with a square groove formed in a substrate, for convenience of alignment in any direction of the groove.

SUMMARY

Provided are a micro-light-emitting diode (LED) array including micro-LEDs and a driving circuit substrate that include electrodes having appropriate structures for efficient alignment of the plurality of micro-LEDs with a substrate, and a method of manufacturing the micro-LED array.

Additional aspects will be set forth in part in the description which follows and, in part, will be apparent from the description, or may be learned by practice of the presented embodiments of the disclosure.

According to an aspect of an embodiment, a method of manufacturing a micro-light-emitting diode (LED) array includes: providing a first substrate including a plurality of circular grooves formed on a first surface thereof; supplying a plurality of micro-LEDs onto the first surface of the first substrate; and aligning the plurality of micro-LEDs with the plurality of circular grooves.

At least two electrodes may be formed on a second surface of each of the plurality of micro-LEDs to be apart from each other.

The at least two electrodes may include a first electrode formed to be relatively close to a center of the second surface and at least one second electrode formed at an edge of the second surface.

A size of each of the plurality of micro-LEDs may be less than a size of each of the plurality of circular grooves included in the first substrate.

The aligning of the plurality of micro-LEDs with the plurality of circular grooves may include positioning the plurality of micro-LEDs such that the at least two electrodes included in each of the plurality of micro-LEDs are positioned toward upper openings of the plurality of circular grooves.

The second surface may have a polygonal shape.

The method may further include: providing a second substrate including a third surface in which a plurality of electrode structures are formed to correspond to the plurality of circular grooves of the first substrate; arranging the first substrate and the second substrate to face each other such that the plurality of circular grooves of the first substrate and the plurality of electrode structures of the second substrate face each other; and bonding the plurality of micro-LEDs aligned with the plurality of circular grooves to the plurality of electrode structures.

Each of the plurality of electrode structures of the second substrate may include a first driving electrode and a second driving electrode formed to be apart from the first driving electrode and surrounding the first driving electrode.

The second driving electrode may have a ring shape.

The second driving electrode may include at least two sub-driving electrodes that are apart from each other.

The bonding of the plurality of micro-LEDs to the plurality of electrode structures may include electrically connecting the first electrode with the first driving electrode and electrically connecting the at least one second electrode with the second driving electrode.

The first substrate may include a plurality of electrode structures respectively provided in the plurality of circular grooves.

The aligning of the plurality of micro-LEDs with the plurality of circular grooves may include positioning the plurality of micro-LEDs such that the at least two electrodes formed in each of the plurality of micro-LEDs are positioned toward the plurality of electrode structures respectively provided in the plurality of circular grooves.

Each of the plurality of electrode structures of the first substrate may include a first driving electrode and a second driving electrode formed to be apart from the first driving electrode and surrounding the first driving electrode.

The first electrode may face the first driving electrode and the at least one second electrode may face the second driving electrode.

The second driving electrode may have a ring shape.

The second driving electrode may include at least two sub-driving electrodes that are apart from each other.

The method may further include supplying a liquid onto the plurality of circular grooves of the first substrate.

The aligning of the plurality of micro-LEDs with the plurality of circular grooves may include aligning the plurality of micro-LEDs with the plurality of circular grooves by scanning the first substrate with an absorber capable of absorbing the liquid.

According to an aspect of another embodiment, a micro-light-emitting diode (LED) array includes: a driving circuit substrate including a plurality of electrode structures including a first driving electrode provided on a first surface of the driving circuit and a second driving electrode provided on the first surface and provided to be apart from the first driving electrode and surrounding the first driving electrode; and a plurality of micro-LEDs each including at least two electrodes, wherein the at least two electrodes are provided on a second surface of each of the plurality of micro-LEDs to face the plurality of electrode structures, are bonded to the plurality of electrode structures, respectively, and are formed to be apart from each other.

The at least two electrodes may include a first electrode formed to be relatively close to a center of the second surface and at least one second electrode formed at an edge of the second surface.

The first electrode may be provided on the center of the second surface.

The second surface may have a polygonal shape.

A vertex area of the second surface may be rounded.

The first electrode may contact the first driving electrode, and the second electrode may contact the second driving electrode.

The second driving electrode may have a ring shape.

The second driving electrode may include at least two sub-driving electrodes that are apart from each other.

Arrangement directions of at least two of the plurality of micro-LEDs with respect to at least two of the plurality of electrode structures may be different from each other.

The driving circuit substrate may include a plurality of circular grooves formed on the first surface, and the plurality of electrode structures may be respectively provided in the plurality of circular grooves.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
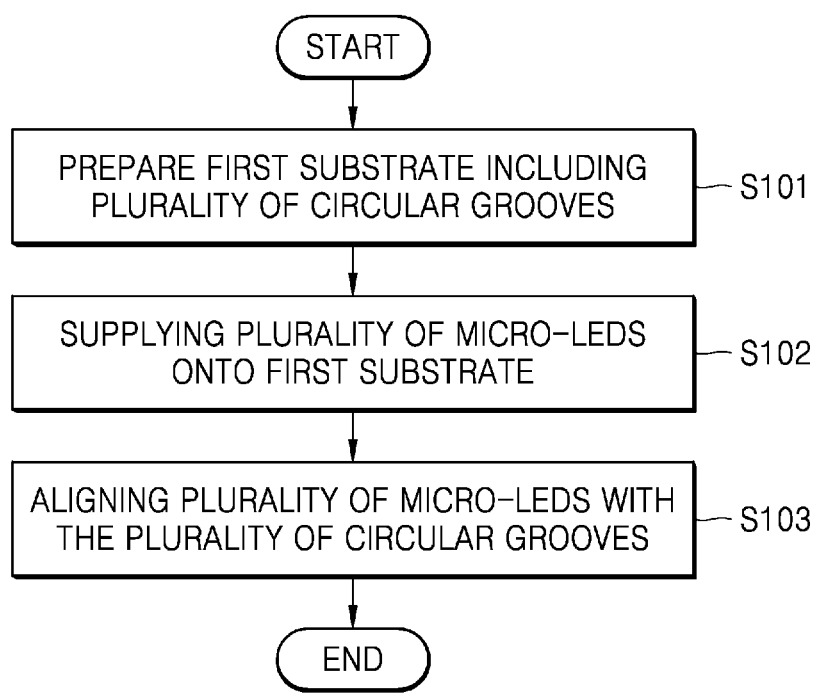
FIG. 1 is a flowchart of a method of manufacturing a micro-light-emitting diode (LED) array, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the drawings, a size or a thickness of each element in the drawings may be exaggerated for clarity and convenience of explanation.

Hereinafter, the expression "above" or "on" may indicate not only a case in which an element is directly above and in contact with another element, but also a case in which the element is above but is not in contact with the other element. As used herein, the singular terms "a" and "an" are intended to include the plural forms as well, unless the context clearly indicates otherwise. It will be further understood that when a part "includes" or "comprises" an element, unless otherwise defined, the part may further include other elements, not excluding the other elements.

The term "the" and other equivalent determiners may correspond to a singular referent or a plural referent. The use of all examples or exemplary terms is to specifically describe the disclosure, and unless otherwise defined by the claims, the scope of the disclosure is not limited by these examples or exemplary terms.

Although the terms first, second, etc. may be used herein to describe various elements, the terms do not limit the components. These terms are only used to distinguish one element from another.

Also, the terms such as " . . . unit," "module," or the like used in the specification indicate an unit, which processes at least one function or motion, and the unit may be implemented by hardware or software, or by a combination of hardware and software.

Particular executions described in the embodiments are examples and do not limit the technical scope by any means. For the sake of brevity, conventional electronics, control systems, software development and other functional aspects of the systems may not be described. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device.

Unless orders of operations included in a method are specifically described or there are contrary descriptions, the operations may be performed according to appropriate orders.

Figure 2:
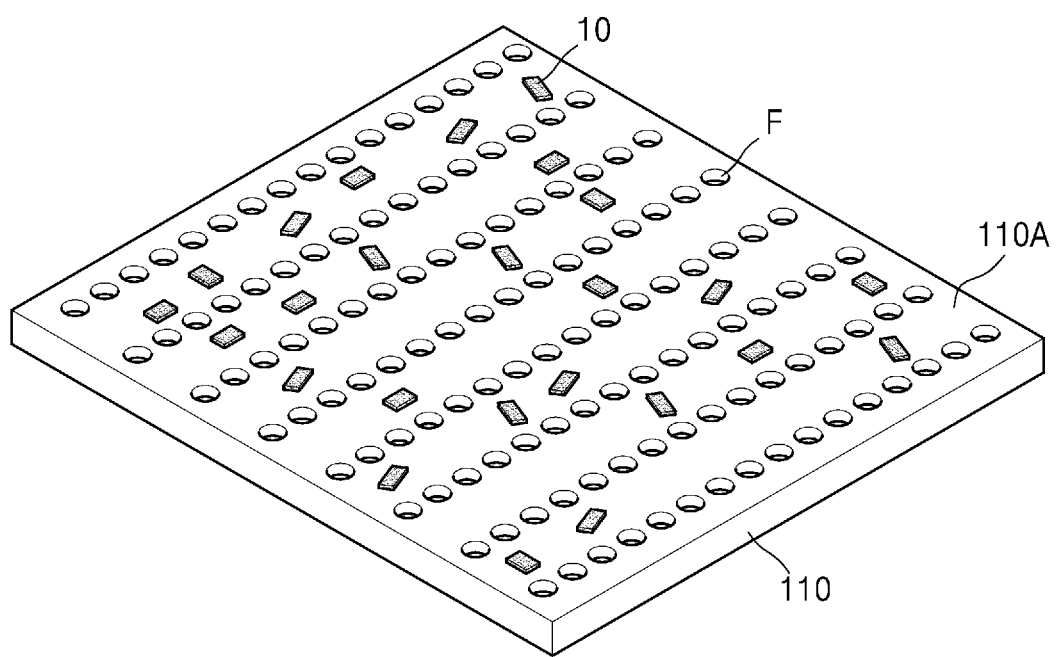
FIG. 2 is a schematic diagram of an example structure of a first substrate and micro-LEDs used to manufacture a micro-LED array.

FIG. 1 is a flowchart of a method of manufacturing a micro-light-emitting diode (LED) array, according to an embodiment. FIG. 2 is a schematic diagram of an example structure of a first substrate 110 and micro-LEDs 10 used to manufacture the micro-LED array.

The method of manufacturing the micro-LED array according to an embodiment illustrated in FIG. 1 may be applied to both of a wet alignment method and a dry alignment method. However, the disclosure is not limited thereto, and the method of manufacturing the micro-LED array may be applied to other various possible methods as well as to the wet alignment method and the dry alignment method.

Referring to FIG. 1, the method of manufacturing the micro-LED array, according to an embodiment, may include operation S101 of preparing the first substrate 110 including a plurality of circular grooves F formed on a first surface 110A thereof, operation S102 of supplying the plurality of micro-LEDs 10 onto the first surface 110A of the first substrate 110, and operation S103 of aligning the plurality of micro-LEDs 10 with the plurality of circular grooves F.

For manufacturing the micro-LED array, in operation S101, the first substrate 110 may be prepared by forming the plurality of circular grooves F on the first surface 110A of the first substrate 110. The first substrate 110 may include a single layer or a plurality of layers. The plurality of circular grooves F may be provided to arrange at least one micro-LED 10. A size of each of the plurality of micro-LEDs 10 may be less than a size of each of the plurality of circular grooves F included in the first substrate 110. For example, the sizes of the plurality of micro-LEDs 10 may be less than diameters of the plurality of circular grooves F.

In operation S102, the plurality of micro-LEDs 10 may be supplied onto the first surface 110A of the first substrate 110. To supply the plurality of micro-LEDs 10, various methods, for example, a spraying method, a dispensing method, an inkjet dot method, a method of spilling a suspension over the first substrate 110, etc., may be used. The method of supplying the plurality of micro-LEDs 10 onto the first substrate 110 is not limited thereto and may be variously modified.

In operation S103, the plurality of micro-LEDs 10 may be aligned with the plurality of circular grooves F. The plurality of micro-LEDs 10 may be aligned with the plurality of circular grooves F by using various methods. For example, a wet alignment method, a dry alignment method, or the like, may be used to align the plurality of micro-LEDs 10 with the plurality of circular grooves F. In this case, one micro-LED 10 may be prepared in each of the plurality of circular grooves F. By referring to FIGS. 9 through 12, a method of aligning the plurality of micro-LEDs with the plurality of circular grooves F by using, for example, a wet alignment method will be described below.

Figure 3:
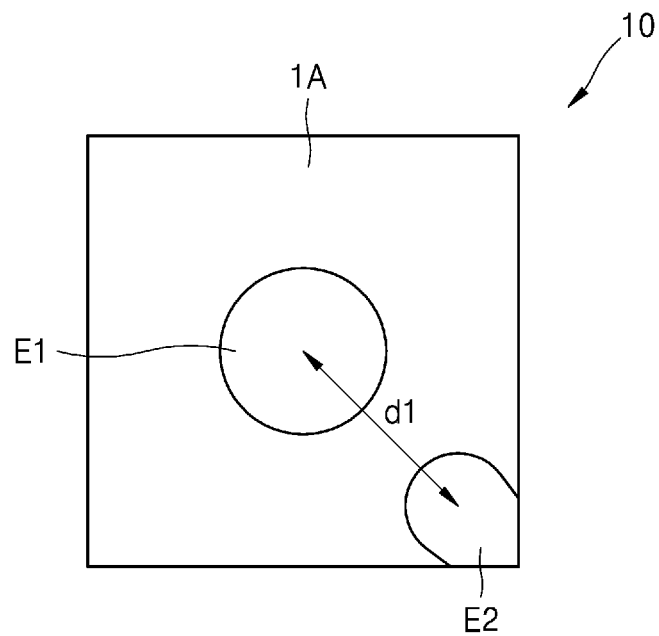
FIG. 3 is a schematic diagram of a structure of any one of a plurality of micro-LEDs, according to an embodiment.
Figure 4:
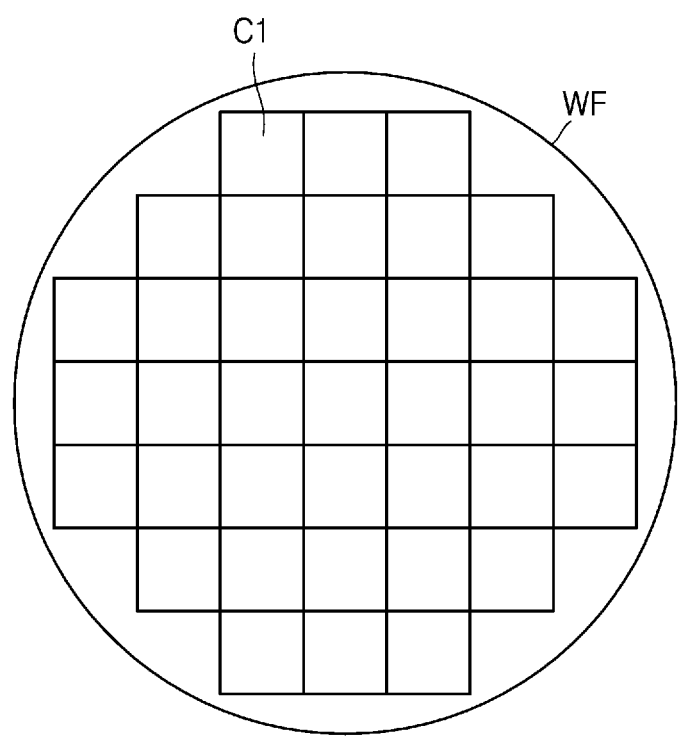
FIG. 4 is a schematic diagram of a structure of a wafer used to manufacture a plurality of micro-LEDs, according to an embodiment.
Figure 5:
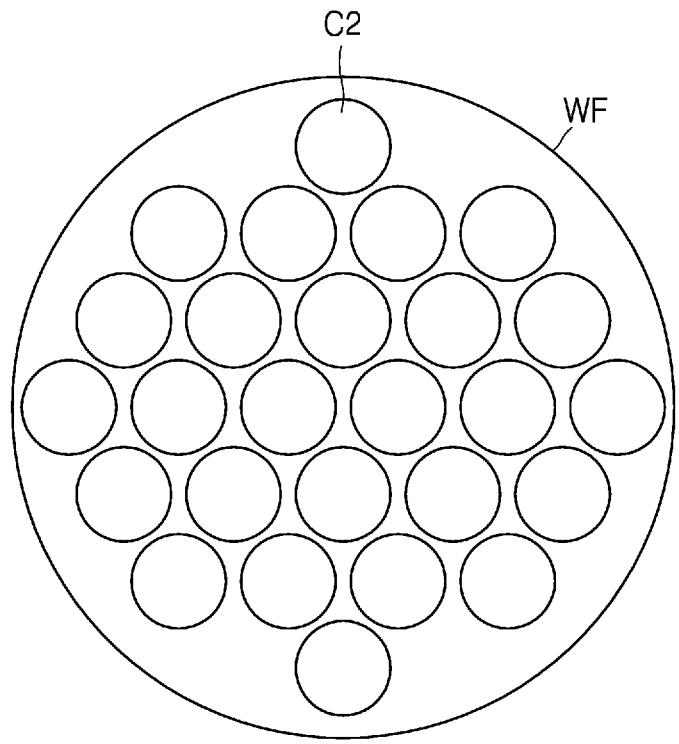
FIG. 5 is a schematic diagram of a structure of a wafer used to manufacture a plurality of micro-LEDs, according to a comparative embodiment.

FIG. 3 is a schematic diagram of a structure of any one of the plurality of micro-LEDs 10, according to an embodiment. FIG. 4 is a schematic diagram of a structure of a wafer WF that is used to manufacture the plurality of micro-LEDs 10, according to an embodiment. FIG. 5 is a schematic diagram of a structure of the wafer WF that is used to manufacture the plurality of micro-LEDs 10, according to a comparative embodiment.

Referring to FIG. 3, each of the plurality of micro-LEDs 10 may include at least two electrodes E1 and E2 formed to be apart from each other on a second surface 1A of the micro-LED 10. The at least two electrodes E1 and E2 may include a conductive material, such as metal, etc. However, the at least two electrodes E1 and E2 are not limited thereto and may include various conductive materials, in addition to metal. The second surface 1A of each of the plurality of micro-LEDs 10, on which the at least two electrodes E1 and E2 are provided, may have a polygonal shape. For example, the second surface 1A of each of the plurality of micro-LEDs 10, on which the at least two electrodes E1 and E2 are provided, may have a square shape. However, the second surface 1A of each of the plurality of micro-LEDs 10, on which the at least two electrodes E1 and E2 are provided, is not limited thereto and may have various shapes.

Referring to FIG. 4, the plurality of micro-LEDs 10 may be formed by dicing the wafer WF. For example, the plurality of micro-LEDs 10 may be formed by dicing the wafer WF into a plurality of squares having a size of 40 μm×40 μm. Accordingly, an area C1 of the wafer WF, which remains after the plurality of micro-LEDs 10 are diced, may have a square shape. FIG. 4 illustrates thirty seven areas C1. However, the number of areas C1 is not limited thereto. For example, the wafer WF having a circular shape and having a diameter of dozens of centimeters may be diced to form a very large number of micro-LEDs 10. Unlike this, referring to FIG. 5, an area C2 of the wafer WF, which remains after the plurality of micro-LEDs 10 are diced, may have a circular shape, according to a comparative embodiment. Like this, when the wafer WF is diced into a plurality of circular shapes, a space between each area C2 remaining after the plurality of micro-LEDs are diced may be greater than that of the case illustrated in FIG. 4, where the wafer WF is diced into the plurality of square shapes. Accordingly, in order to form the same number of micro-LEDs, a greater number of wafers WF may be consumed. Thus, it may be more expensive to form the plurality of micro-LEDs. In other words, as illustrated in FIGS. 3 and 4, when the plurality of micro-LEDs 10 are formed to have polygonal planes, the wafer WF may be efficiently used and costs may be spared.

Referring to FIG. 3 again, the at least two electrodes E1 and E2 may include a first electrode E1 provided to be relatively close to a center of the second surface 1A of each of the plurality of micro-LEDs 10 and at least one second electrode E2 provided at an edge of the second surface 1A of each of the plurality of micro-LEDs 10. For example, as illustrated in FIG. 3, the first electrode E1 may be provided at the center of the second surface 1A of each of the plurality of micro-LEDs 10. Also, as illustrated in FIG. 3, the at least one second electrode E2 may be provided at a corner area of the second surface 1A of each of the plurality of micro-LEDs 10. In this case, a distance d1 between a center of the first electrode E1 and a center of the second electrode E2 may be slightly less than a half of a diagonal distance of the second surface 1A of each of the plurality of micro-LEDs 10, on which the at least two electrodes E1 and E2 are provided.

Figure 6:
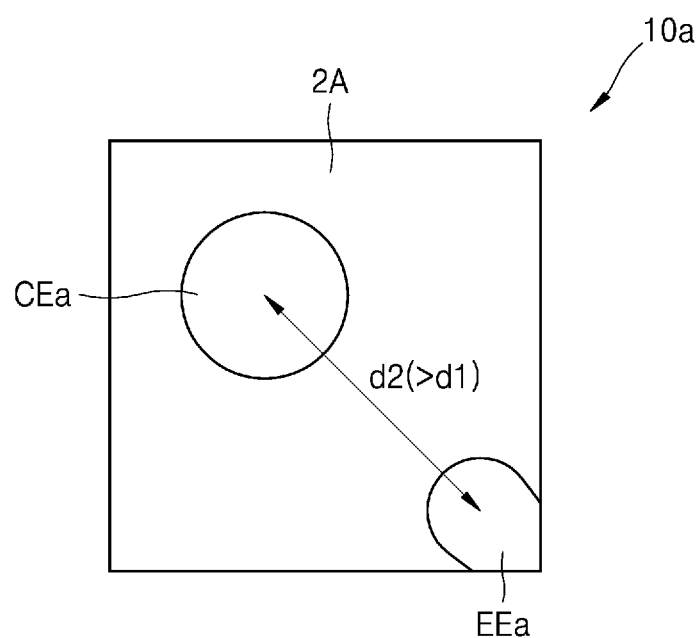
FIG. 6 is a schematic diagram of a structure of any one of a plurality of micro-LEDs, according to another embodiment.

FIG. 6 is a schematic diagram of a structure of any one of a plurality of micro-LEDs 10a, according to another embodiment. The plurality of micro-LEDs 10a of FIG. 6 may be used in the method of manufacturing the micro-LED array described with reference to FIGS. 1 and 2.

Referring to FIG. 6, each of the plurality of micro-LEDs 10a may include at least two electrodes CEa and EEa formed to be apart from each other on a second surface 2A of the micro-LED 10a. The at least two electrodes CEa and EEa may include a conductive material, such as metal, etc. However, the at least two electrodes CEa and EEa are not limited thereto and may include various conductive materials, in addition to metal. The second surface 2A of each of the plurality of micro-LEDs 10a, on which the at least two electrodes CEa and EEa are provided, may have a polygonal shape. For example, the second surface 2A of each of the plurality of micro-LEDs 10a, on which the at least two electrodes CEa and EEa are provided, may have a square shape. However, the second surface 2A of each of the plurality of micro-LEDs 10a, on which the at least two electrodes CEa and EEa are provided, is not limited thereto.

The at least two electrodes CEa and EEa may include a first electrode CEa provided to be relatively close to a center of the second surface 2A of each of the plurality of micro-LEDs 10a and a second electrode EEa provided at an edge of the second surface 2A of each of the plurality of micro-LEDs 10a. For example, as illustrated in FIG. 6, the first electrode CEa may be provided at a position that is slightly apart, by a predetermined distance, from the center of the second surface 2A of each of the plurality of micro-LEDs 10a toward a corner area. Also, as illustrated in FIG. 6, the at least one second electrode EEa may be provided at a corner area of the second surface 2A of each of the plurality of micro-LEDs 10a. In this case, a distance d2 between a center of the first electrode CEa and a center of the second electrode EEa may be greater than the distance d1 between the center of the first electrode E1 and the center of the second electrode E2 of FIG. 3.

Figure 7:
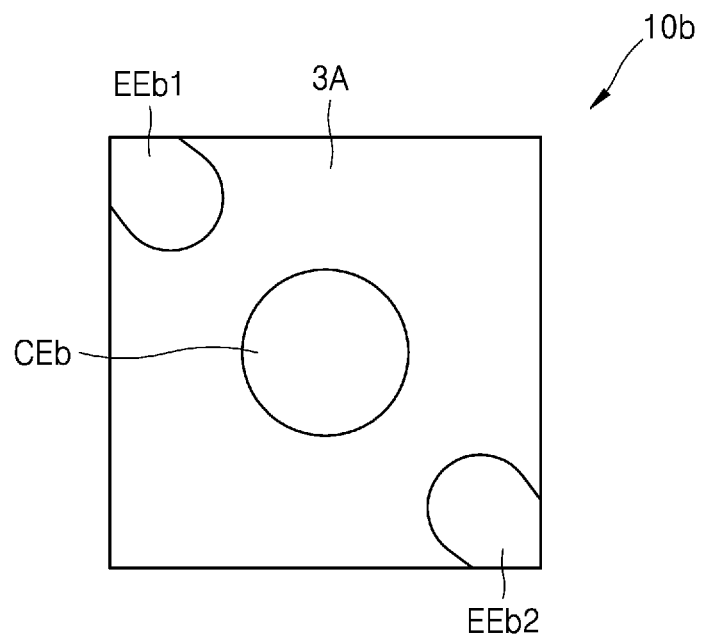
FIG. 7 is a schematic diagram of a structure of any one of a plurality of micro-LEDs, according to another embodiment.

FIG. 7 is a schematic diagram of a structure of any one of a plurality of micro-LEDs 10b, according to another embodiment. The plurality of micro-LEDs 10b of FIG. 7 may be used in the method of manufacturing the micro-LED array described with reference to FIGS. 1 and 2.

Referring to FIG. 7, each of the plurality of micro-LEDs 10*b* may include two or more electrodes CEb, EEb1, and EEb2 formed to be apart from each other on a second surface 3A of the micro-LED 10*b*. The two or more electrodes CEb, EEb1, and EEb2 may include a conductive material, such as metal, etc. However, the two or more electrodes CEb, EEb1, and EEb2 are not limited thereto and may include various conductive materials, in addition to metal. The second surface 3A of each of the plurality of micro-LEDs 10*b*, on which the two or more electrodes CEb, EEb1, and EEb2 are provided, may have a polygonal shape. For example, the second surface 3A of each of the plurality of micro-LEDs 10*b*, on which the two or more electrodes CEb, EEb1, and EEb2 are provided, may have a square shape. However, the second surface 3A of each of the plurality of micro-LEDs 10*b*, on which the two or more electrodes CEb, EEb1, and EEb2 are provided, is not limited thereto.

The two or more electrodes CEb, EEb1, and EEb2 may include a first electrode CEb provided to be relatively close to a center of the second surface 3A of each of the plurality of micro-LEDs 10*b* and one or more second electrodes EEb1 and EEb2 provided at an edge of the second surface 3A of each of the plurality of micro-LEDs 10*b*. For example, as illustrated in FIG. 7, the first electrode CEb may be provided at the center of the second surface 3A of each of the plurality of micro-LEDs 10*b*. Also, as illustrated in FIG. 7, the two second electrodes EEb1 and EEb2 may be provided at a corner area of the second surface 3A of each of the plurality of micro-LEDs 10*b*. For example, the first electrode CEb and the two second electrodes EEb1 and EEb2 may be provided in a row on a diagonal line of the second surface 3A of each of the plurality of micro-LEDs 10*b*, on which the two or more electrodes CEb1, EEb1, and EEb2 are provided.

Figure 8:
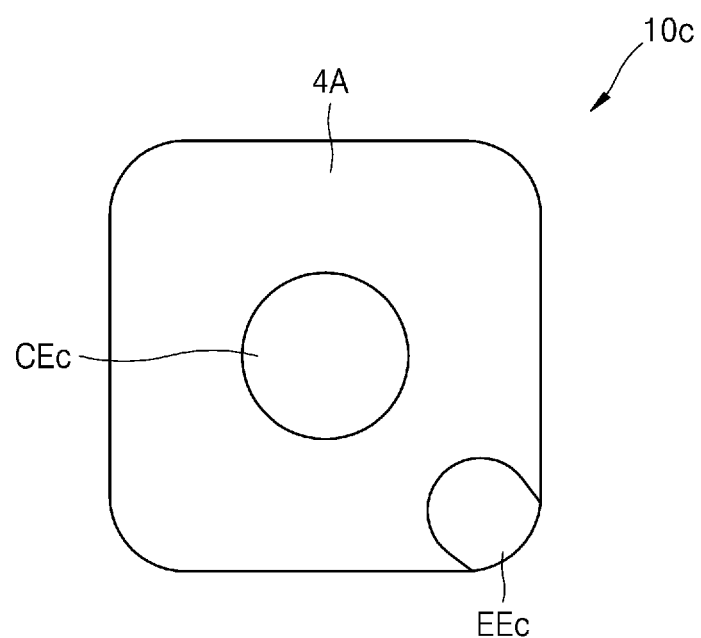
FIG. 8 is a schematic diagram of a structure of any one of a plurality of micro-LEDs, according to another embodiment.

FIG. 8 is a schematic diagram of a structure of any one of a plurality of micro-LEDs 10*c*, according to another embodiment. The plurality of micro-LEDs 10*c* of FIG. 8 may be used in the method of manufacturing the micro-LED array described with reference to FIGS. 1 and 2.

Figure 10:
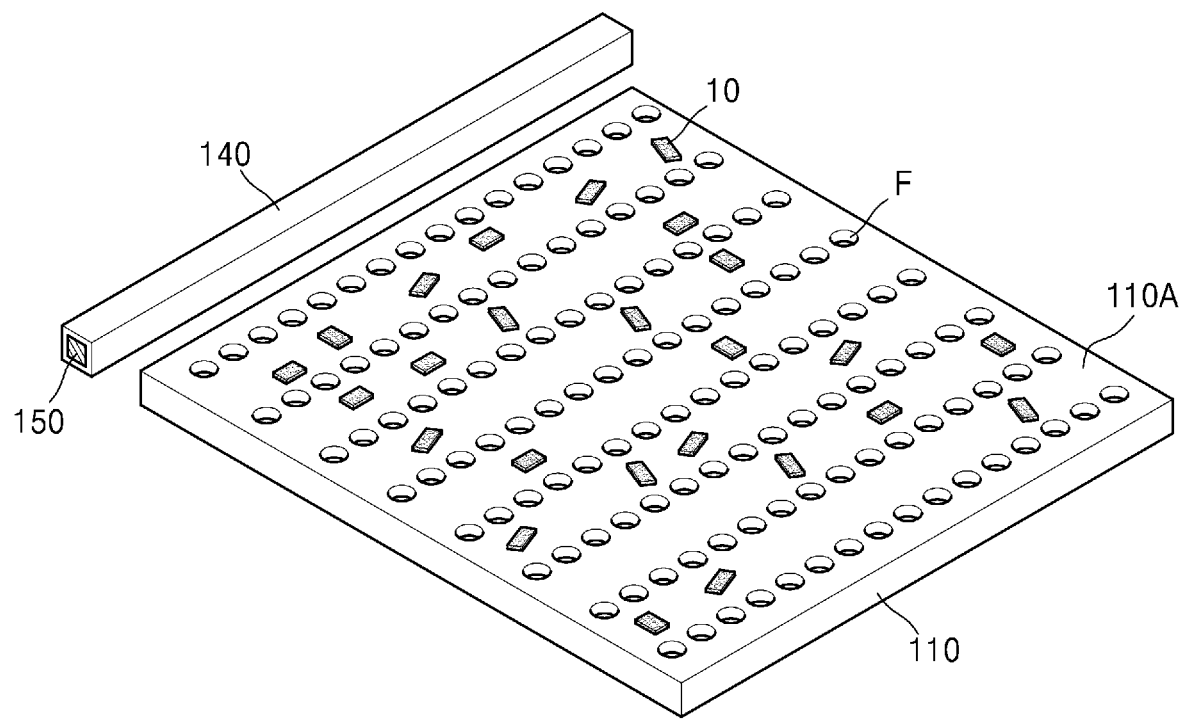
FIG. 10 is a schematic diagram of a structure of an apparatus for manufacturing a micro-LED array, according to an embodiment.

The plurality of micro-LEDs 10*c* of FIG. 8 may be substantially the same as the plurality of micro-LEDs 10 of FIG. 3, except that the plurality of micro-LEDs 10*c* of FIG. 10 include rounded vertex areas on a second surface 4A thereof. While describing FIG. 8, aspects that are the same as those of FIG. 3 are omitted.

Referring to FIG. 8, each of the plurality of micro-LEDs 10*c* may include at least two electrodes CEc and EEc formed to be apart from each other on the second surface 4A of the micro-LED 10*c*. The second surface 4A of each of the plurality of micro-LEDs 10*c*, on which the at least two electrodes CEc and EEc are provided, may have a polygonal shape including rounded vertex areas. For example, the second surface 4A of each of the plurality of micro-LEDs 10*c*, on which the at least two electrodes CEc and EEc are provided, may have a square shape including rounded vertex areas. Accordingly, a corner area of the second surface 4A of each of the plurality of micro-LEDs 10*c*, on which the at least two electrodes CEc and EEc are provided, may include a curved line. As shown above, when a micro-LED array is manufactured by using the plurality of micro-LEDs 10*c* including the curved corner areas, abrasion between the plurality of micro-LEDs 10*c* may be reduced.

Figure 9:
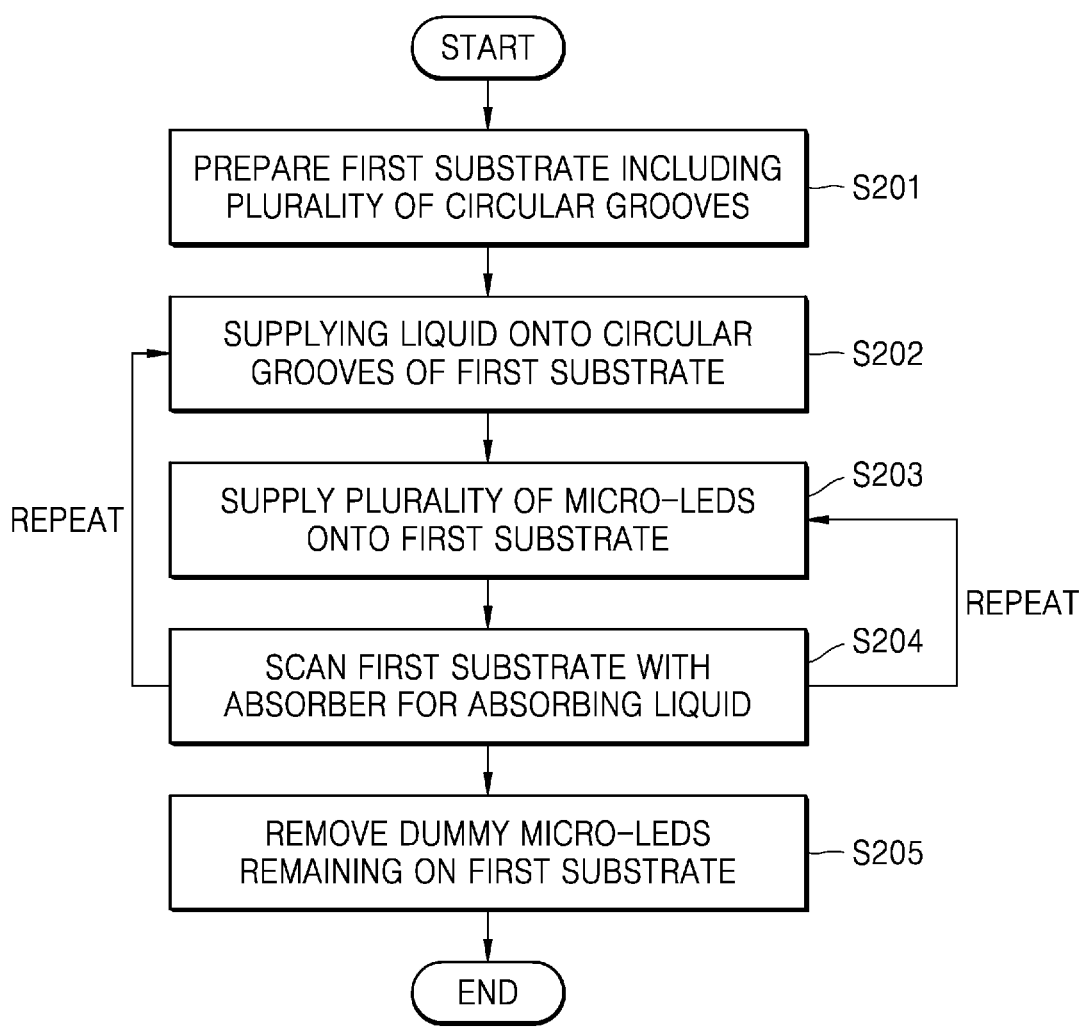
FIG. 9 is a flowchart of a method of manufacturing a micro-LED array, according to another embodiment.
Figure 11:
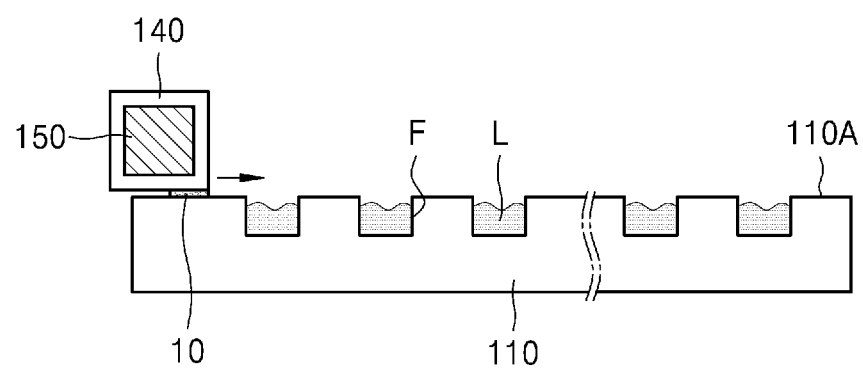
FIG. 11 is a diagram showing a scanning operation of a method of manufacturing a micro-LED array, according to an embodiment.
Figure 12:
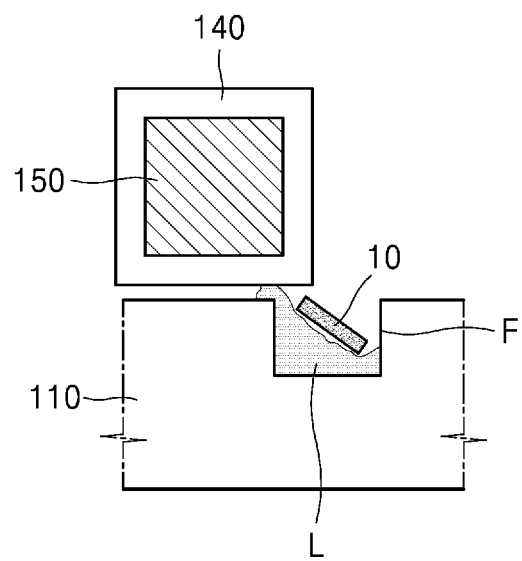
FIG. 12 is a diagram showing a process in which a micro-LED is aligned according to a method of manufacturing a micro-LED array, according to an embodiment.

FIG. 9 is a schematic flowchart of a method of manufacturing a micro-LED array, according to another embodiment. FIG. 10 is a schematic diagram of a structure of an apparatus for manufacturing a micro-LED array, according to an embodiment. FIG. 11 is a diagram showing a scanning operation included in a method of manufacturing a micro-LED array, according to an embodiment. FIG. 12 is a diagram showing a process of in which a micro-LED is aligned, according to a method of manufacturing a micro-LED array, according to an embodiment.

The method of manufacturing the micro-LED array, according to an embodiment, illustrated in FIG. 9, corresponds to a wet alignment method.

Referring to FIG. 9, the method of manufacturing the micro-LED array, according to an embodiment, may include operation S201 of preparing a first substrate 110 including a plurality of circular grooves F formed on a first surface 110A of the first substrate 110, operation S202 of supplying a liquid L to the plurality of circular grooves F in the first substrate 110, operation S203 of supplying a plurality of micro-LEDs 10 onto the first surface 110A of the first substrate 110, and operation S204 of aligning the plurality of micro-LEDs 10 with the plurality of circular grooves F by scanning the first substrate 110 by using an absorber 140 for absorbing the liquid L. Also, the method of manufacturing the micro-LED array according to an embodiment may further include operation 205 of removing a dummy micro-LED remaining on the first substrate 110 after all of the plurality of micro-LEDs 10 are transferred onto the first substrate 110. Hereinafter, the method of manufacturing the micro-LED array according to an embodiment is described with reference to FIGS. 9 through 12.

The first substrate 110 including the plurality of circular grooves F formed in the first surface 110A may be prepared (operation S201). The first substrate 110 may include a single layer or a plurality of layers. The plurality of circular grooves F may be provided to arrange the micro-LEDs 10. A size of each of the plurality of micro-LEDs 10 may be less than a size of each of the plurality of circular grooves F included in the first substrate 110. For example, the sizes of the plurality of micro-LEDs 10 may be less than diameters of the plurality of circular grooves F.

The liquid L may be supplied to the plurality of circular grooves F (operation S202). The liquid L may include any type of liquid that does not corrode or damage the micro-LEDs 10. The liquid L may include, for example, at least one of the group including water, ethanol, alcohol, polyol, ketone, halocarbon, acetone, a flux, or an organic solvent. The organic solvent may include, for example, isopropyl alcohol (IPA). The liquid L is not limited thereto and may be variously modified.

To supply the liquid L to the plurality of circular grooves F, various methods, for example, a spraying method, a dispensing method, an inkjet dot method, a method of spilling the liquid L over the first substrate 110, etc., may be used.

The plurality of micro-LEDs 10 may be supplied onto the first substrate 110 (operation S203). The plurality of micro-LEDs 10 may be directly sprinkled over the first substrate 110 without a liquid or may be supplied onto the first substrate 110 by using materials other than the liquid. Alternatively, the plurality of micro-LEDs 10 may be supplied onto the first substrate 110 while being contained in a suspension, by using various methods. In this case, the plurality of micro-LEDs 10 may be supplied onto the first substrate 110 by using various methods, such as a spraying method, a dispensing method, an inkjet dot method, a method of spilling the suspension over the first substrate 110, etc. The method of supplying the plurality of micro-LEDs 10 onto the first substrate 110 is not limited thereto and may be variously modified. The liquid L may be rightly provided in the plurality of circular grooves F or may be provided to spill over the plurality of circular grooves F. The supplying amount of the liquid L may be variously adjusted.

The first substrate 110 may be scanned with the absorber 140 capable of absorbing a liquid (operation S204). The absorber 140 may include any material capable of absorbing a liquid, and a shape or a structure thereof is not particularly limited. The absorber 140 may include, for example, a fabric, a tissue, a polyester fiber, a paper, a wiper, etc. The absorber 140 may be solely used without other auxiliary instruments. However, the absorber 140 is not limited thereto. The absorber 140 may be coupled to a supporting plate 150 so as to conveniently scan the first substrate 110. The supporting plate 150 may have various shapes and structures that are appropriate for scanning the first substrate 110. The supporting plate 150 may include, for example, a rod, a blade, a plate, a wiper, or the like. Also, the absorber 140 may be provided on a surface of the supporting plate 150 or may be wound along a circumference of the supporting plate 150.

The absorber 140 may scan the first substrate 110 by pressurizing the first substrate 110 by applying an appropriate pressure to the first substrate 110. The scanning may include making the absorber 140 contact the first substrate 110 and pass through the plurality of circular grooves F. During the scanning, the liquid L may be absorbed by the absorber 140. The scanning may be performed based on various methods including, for example, at least one of sliding, rotating, translating, reciprocating, rolling, spinning, or rubbing of the absorber 140. Here, the methods may include both regular movements and irregular movements. Alternatively, the scanning may include at least one of rotating, translating, rolling, or spinning of the first substrate 110. Alternatively, the scanning may be performed via collaboration of the absorber 140 and the first substrate 110.

The scanning of the first substrate 110 with the absorber 140 may include making the absorber 140 pass through the plurality of circular grooves F and absorb the liquid L at the plurality of circular grooves F. While the absorber 140 scans the first substrate 110, at least one of the plurality of micro-LEDs 10 may be coupled to the absorber 140. When the absorber 140 passes through the plurality of circular grooves F, the absorber 140 may come into contact with the first substrate 110.

With respect to FIG. 9, the supplying (operation S202) of the liquid L to the plurality of circular grooves F of the first substrate 110 and the supplying (operation S203) of the plurality of micro-LEDs 10 to the first substrate 110 may be separate operations from each other and may be sequentially performed in the stated order or in the opposite order. Alternatively, the supplying (operation S202) of the liquid L to the plurality of circular grooves F of the first substrate 110 and the supplying (operation S203) of the plurality of micro-LEDs 10 to the first substrate 110 may be integrated in one operation and may be simultaneously performed.

Next, after all of the micro-LEDs 10 are transferred to the first substrate 110, dummy micro-LEDs remaining on the first substrate 110 may be removed (operation S205).

Referring to FIG. 11, the absorber 140 may be provided on a surface of the supporting plate 150, and the absorber 140 may perform the scanning while contacting the surface of the first substrate 110. While the absorber 140 performs the scanning, one or more of the plurality of micro-LEDs 10 may be adsorbed or coupled onto a surface of the absorber 140. The adsorbed or coupled one or more of the plurality of micro-LEDs 10 may be pushed forward by the absorber 140. The plurality of micro-LEDs 10 may be located between the absorber 140 and the first substrate 110.

FIG. 11 is an enlarged diagram of any one of the plurality of circular grooves F. At least one of the micro-LEDs 10 that are moved by the absorber 140 may be disposed into any one of the plurality of circular grooves F. Here, the absorber 140 may absorb the liquid L at any one of the plurality of circular grooves F and at least one of the micro-LEDs 10 may be disposed into the one of the plurality of circular grooves F.

Referring to FIGS. 9 and 10 again, at least one of operations S202, S203, and S204 may be repeated according to necessity, until all of the plurality of micro-LEDs 10 are transferred to the plurality of circular grooves F of the first substrate 110. For example, after the absorber 140 scans the first substrate 110, when the plurality of circular grooves F do not contain the liquid L or have the insufficient liquid L, the supplying (operation S202) of the liquid L to the plurality of circular grooves F may further be performed. Here, when the first substrate 110 do not lack the plurality of micro-LEDs 10, operation S203 may not be performed and processes may proceed to operation S204 from operation S202. Alternatively, when the liquid L is excessively supplied to the first substrate 110, some of the liquid L may be removed by using a blade according to necessity.

Alternatively, after the absorber 140 scans the first substrate 110, when the first substrate 110 lack the plurality of micro-LEDs 10, the supplying (operation S203) of the plurality of micro-LEDs 10 to the first substrate 110 may further be performed.

Through the processes described above, the plurality of micro-LEDs 10 may be aligned on the first substrate 110.

Referring to FIG. 10, the first substrate 110 may include, for example, a mold substrate. The plurality of circular grooves F may be provided in the first surface 110A of the first substrate 110. An oxide layer may further be provided in the middle of the first substrate 110. The oxide layer may include, for example, $SiO_2$, $Al_2O_3$, or $NiO_2$. The oxide layer included in the first substrate 110 may be exposed to the outside through the plurality of circular grooves F. The oxide layer may be hydrophilic. The oxide layer may facilitate filling of the plurality of circular grooves F with a liquid. An area of an upper surface of the first substrate 110 may be greater than about 4 inches. For example, the area of the upper surface of the first substrate 110 may be greater than about 8 inches and less than about 9 inches. However, it is not limited thereto, and the area of the upper surface of the first substrate 110 may be greater than about 9 inches.

Figure 13:
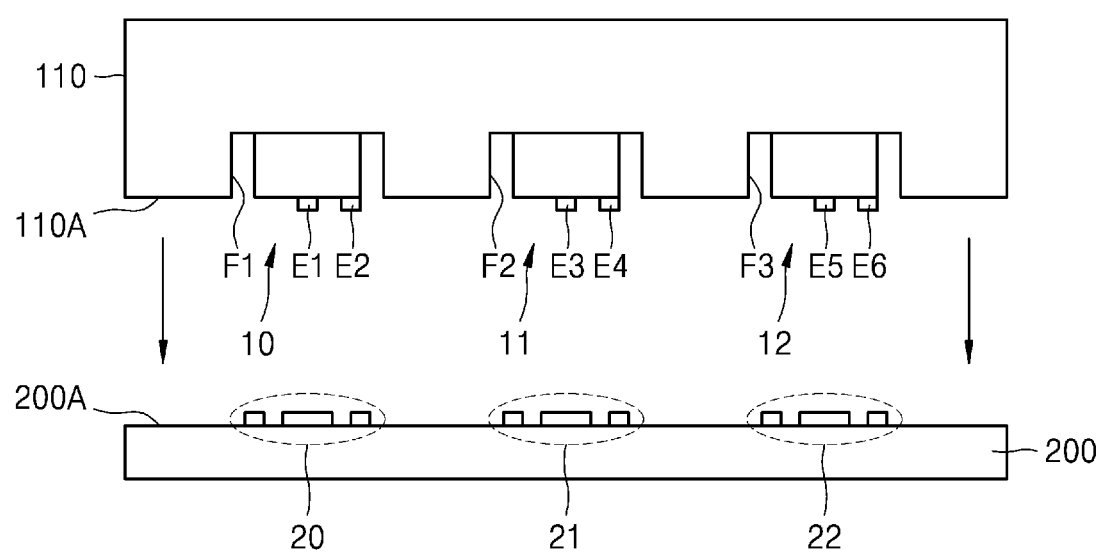
FIG. 13 is a diagram for illustrating a bonding process in which a plurality of micro-LEDs are bonded with a second substrate, the bonding process being included in the method of manufacturing the micro-LED array, according to an embodiment of FIG. 1.
Figure 14:
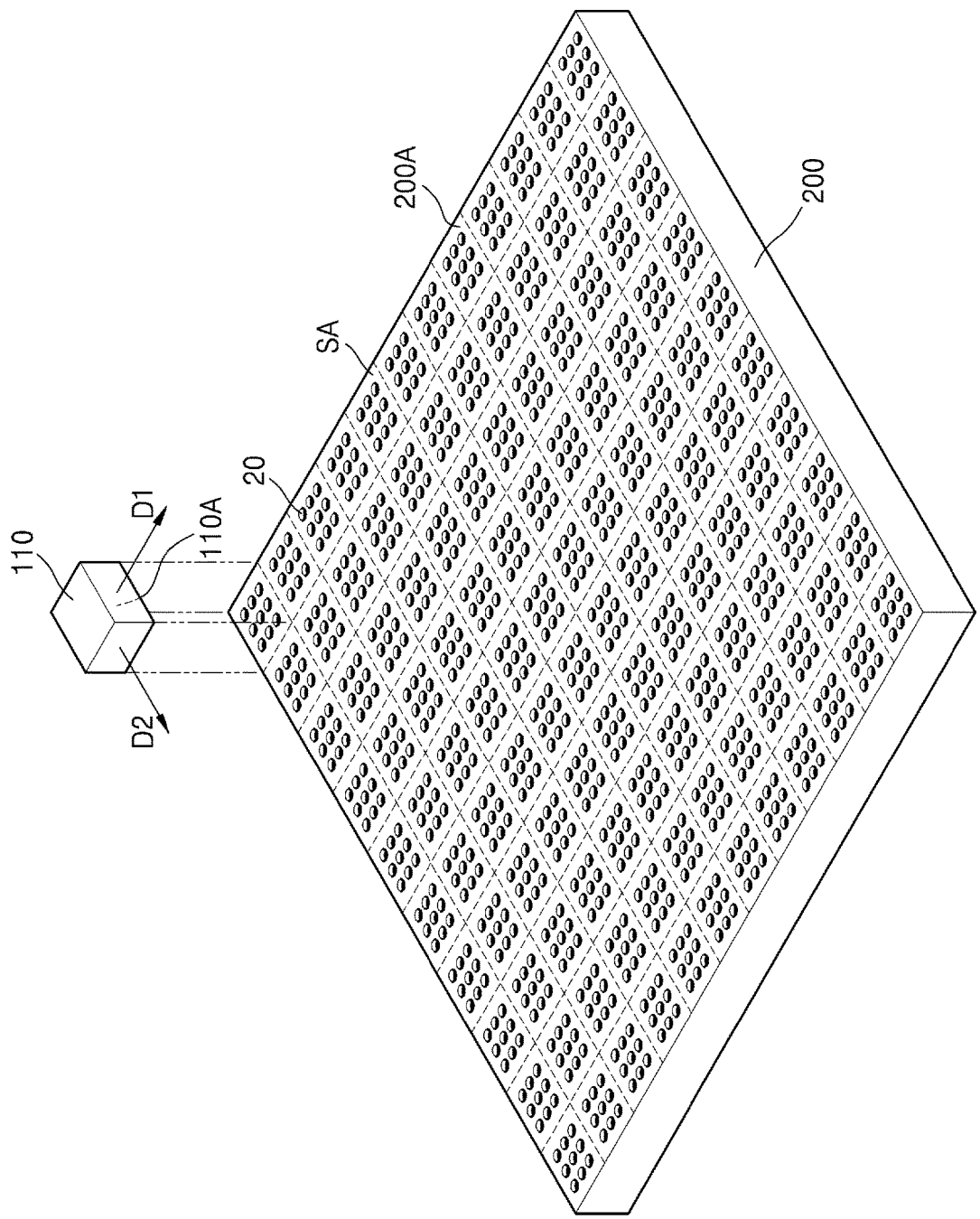
FIG. 14 is a diagram for illustrating a bonding process in which a plurality of micro-LEDs are bonded with a second substrate in a method of manufacturing a micro-LED array, according to another embodiment.
Figure 15:
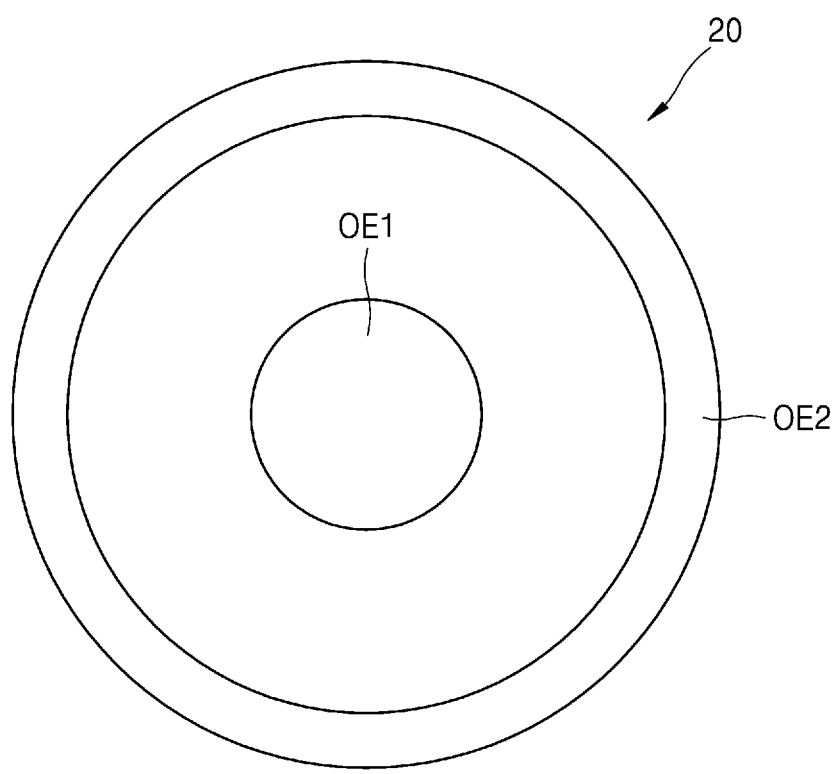
FIG. 15 is a schematic diagram of a structure of an electrode structure formed on the second substrate of FIG. 13, according to an embodiment.
Figure 16:
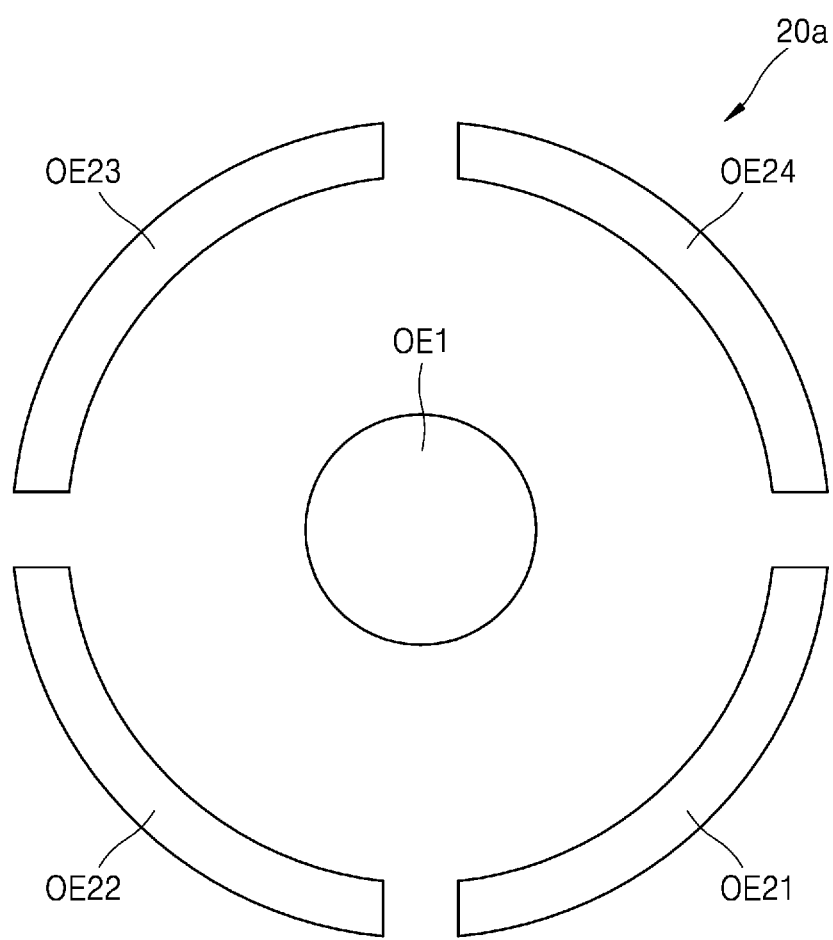
FIG. 16 is a schematic diagram of a structure of an electrode structure formed on the second substrate of FIG. 13, according to another embodiment.
Figure 17:
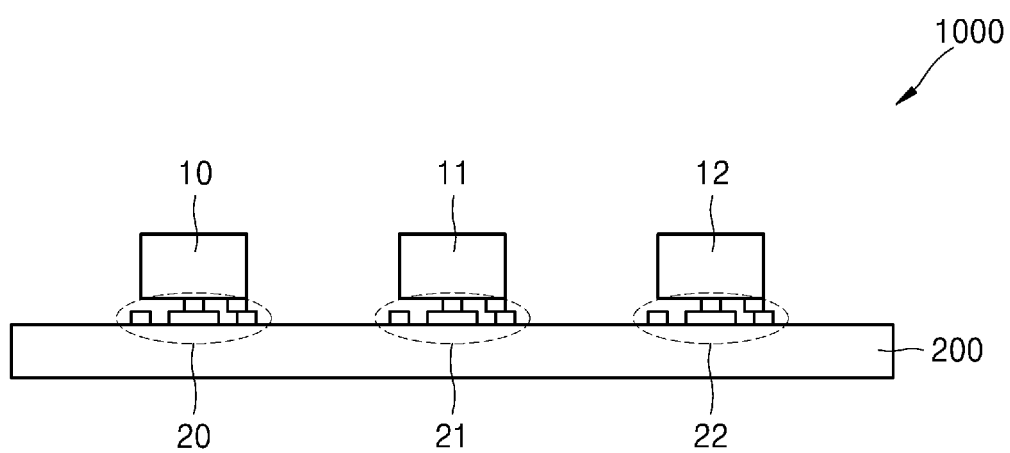
FIG. 17 is a schematic diagram of a structure of a micro-LED array formed according to the method of manufacturing a micro-LED array of FIG. 13.
Figure 18:
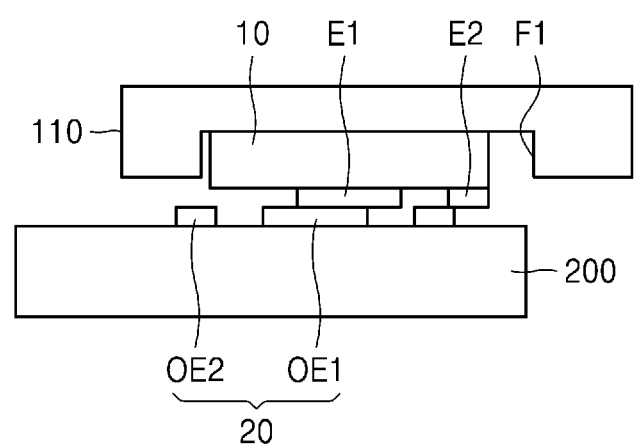
FIG. 18 is a schematic diagram of a shape in which an electrode structure of a second substrate and a micro-LED of a first substrate contact each other, according to an embodiment.
Figure 19:
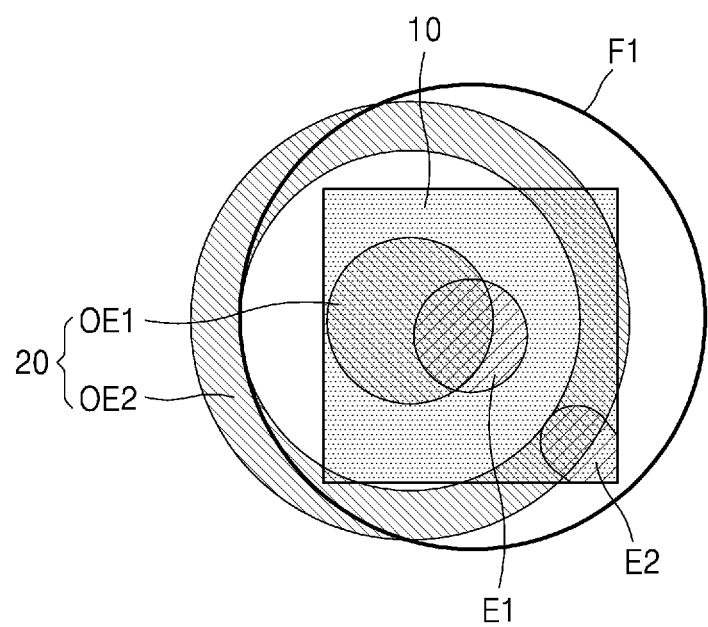
FIG. 19 is a schematic plan view of a structure of the embodiment illustrated in FIG. 18.

FIG. 13 is a diagram for illustrating a bonding process in which a plurality of micro-LEDs 10, 11, and 12 are bonded with a second substrate 200, in the method of manufacturing a micro-LED array according to an embodiment of FIG. 1. FIG. 14 is a diagram for illustrating a bonding process in which the plurality of micro-LEDs 10, 11, and 12 are bonded with the second substrate 200, according to a method of manufacturing a micro-LED array, according to another embodiment. FIG. 15 is a schematic diagram of a structure of an electrode structure 20 formed on the second substrate 200 of FIG. 13, according to an embodiment. FIG. 16 is a schematic diagram of a structure of an electrode structure 20a formed on the second substrate 200 of FIG. 13, according to another embodiment. FIG. 17 is a schematic diagram of a structure of a micro-LED array 1000 formed according to the method of manufacturing the micro-LED array of FIG. 13. FIG. 18 is a schematic diagram of a shape in which the electrode structure 20 of the second substrate 200 and the micro-LEDs 10 of the first substrate 110 contact each other, according to an embodiment. FIG. 19 is a schematic plan view of a structure of the embodiment illustrated in FIG. 18.

Referring to FIG. 13, the method of manufacturing the micro-LED array according to the embodiment of FIG. 1 may further include: providing the second substrate 200 including a third surface 200A in which a plurality of electrode structures 20, 21, and 22 are formed to correspond to a plurality of circular grooves F1, F2, and F3 of the first substrate 110; arranging the first substrate 110 and the second substrate 200 to face each other such that the plurality of circular grooves F1, F2, and F3 in the first substrate 110 face the plurality of electrode structures 20, 21, and 22 of the second substrate 200; and bonding the plurality of micro-LEDs 10, 11, and 12 aligned with the plurality of circular grooves F1, F2, and F3, with the plurality of electrode structures 20, 21, and 22.

The aligning corresponding to the aligning (S103) of the plurality of micro-LEDs 10 with the plurality of circular grooves F of FIG. 1, may include arranging at least two electrodes E1, E2, E3, E4, E5, and E6 included in each of the plurality of micro-LEDs 10, 11, and 12, to face toward upper openings of the plurality of circular grooves F1, F2, and F3. Accordingly, as illustrated in FIG. 13, the at least two electrodes E1, E2, E3, E4, E5, and E6 included in each of the plurality of micro-LEDs 10, 11, and 12 may be exposed to the outside through the upper openings of the plurality of circular grooves F1, F2, and F3. FIG. 13 illustrates three micro-LEDs 10, 11, and 12. However, it is for convenience of explanation, and the disclosure is not limited thereto. For example, the plurality of micro-LEDs 10, 11, and 12 may include a very large number of micro-LEDs.

The second substrate 200 provided according to the method of manufacturing the micro-LED array according to an embodiment may include the plurality of electrode structures 20, 21, and 22 formed on the third surface 200A. FIG. 13 illustrates three electrode structures 20, 21, and 22. However, it is for convenience of explanation, and the disclosure is not limited thereto. For example, the plurality of electrode structures 20, 21, and 22 may include a very large number of electrode structures. The second substrate 200 may include, for example, a driving circuit substrate and may include a plurality of driving circuits corresponding to the plurality of electrode structures 20, 21, and 22. Each of the plurality of driving circuits included in the second substrate 200 may include at least one transistor and at least one capacitor.

According to the method of manufacturing the micro-LED array according to an embodiment, the first substrate 110 and the second substrate 200 may be arranged to face each other, and thus, the plurality of micro-LEDs 10, 11, and 12 and the plurality of electrode structures 20, 21, and 22 may face each other.

According to the method of manufacturing the micro-LED array according to an embodiment, while the first substrate 110 and the second substrate 200 face each other, the plurality of micro-LEDs 10, 11, and 12 and the plurality of electrode structures 20, 21, and 22 may be bonded to each other. For example, the plurality of micro-LEDs 10, 11, and 12 may be pre-bonded with the plurality of driving circuits 20, 21, and 22, by mounting the first substrate 110 on the second substrate 200. Thereafter, the bonding process may be finally completed by applying pressure between the plurality of micro-LEDs 10, 11, and 12 and the second substrate 200 and performing a thermal process.

However, the bonding process is not limited thereto. The bonding process may be completed by providing an adhesive material between the plurality of micro-LEDs 10, 11, and 12 and the plurality of electrode structures 20, 21, and 22. The adhesive material which may be used to bond the plurality of micro-LEDs 10, 11, and 12 with the plurality of electrode structures 20, 21, and 22 may include a conductive material having adhesive power. For example, the adhesive material may include a conductive paste, an anisotropic conductive film (ACF), etc.

Referring to FIG. 14, the third surface 200A of the second substrate 200 and the first surface 110A of the first substrate 110, the second substrate 200 and the first substrate 110 facing each other, may have different areas from each other. For example, the area of the third surface 200A of the second substrate 200 may be greater than the area of the first surface 110A of the first substrate 110. The third surface 200A of the second substrate 200 may include a plurality of sub-surface areas SA each having an area corresponding to the area of the first surface 110A of the first substrate 110. The plurality of electrode structures 20 may be provided on each of the plurality of sub-surface areas SA. FIG. 14 illustrates that nine electrode structures 20 are provided on each of the plurality of sub-surface areas SA. However, it is for convenience of explanation, and the disclosure is not limited thereto. For example, the number of the plurality of electrode structures 20 provided on each of the plurality of sub-surface areas SA may be countless.

According to the method of manufacturing the micro-LED array according to an embodiment, the plurality of micro-LEDs 10, 11, and 12 may be bonded to all of the plurality of sub-surface areas SA of the second substrate 200. For example, the plurality of micro-LEDs 10, 11, and 12 may be bonded to the plurality of electrode structures 20 included in a first sub-surface area of the plurality of sub-surface areas SA. Thereafter, the plurality of micro-LEDs 10, 11, and 12 may be bonded to the plurality of electrode structures 20 included in a second sub-surface area of the plurality of sub-surface areas SA. In this case, as illustrated in FIG. 14, the first substrate 110 facing the second substrate 200 may be sequentially moved in a first direction D1 and a second direction D2 to bond the plurality of micro-LEDs 10, 11, and 12 to all of the plurality of sub-surface areas SA.

Referring to FIGS. 14 and 15, each of the plurality of electrode structures 20 of the second substrate 200 may include a first driving electrode OE1 and a second driving electrode OE2 provided to be apart from the first driving electrode OE1 and surrounding the first driving electrode OE1. The electrode structure 20 including the first driving electrode OE1 and the second driving electrode OE2 may be formed to have the rotational symmetry at all angles. For example, the first driving electrode OE1 may be circular, and the second driving electrode OE2 may have a ring shape such that the second driving electrode OE2 surrounds the circular first driving electrode OE1 in a circumferential direction. However, the first driving electrode OE1 is not limited to the circular shape. The first driving electrode OE1 may be polygonal, for example, quadrangular, triangular, rectangular, etc. In this case, while the second driving electrode OE2 may have the rotational symmetry at all angles, the first driving electrode OE1 may not have the rotational symmetry at all angles.

Referring to FIG. 16, according to another embodiment, a plurality of electrode structures 20a which may be formed on the second substrate 200 may include the first driving electrode OE1 and two or more sub-driving electrodes OE21, OE22, OE23, and OE24 apart from each other and apart from the first driving electrode OE1 and surrounding the first driving electrode OE1. In this case, the two or more sub-driving electrodes OE21, OE22, OE23, and OE24 may be referred to as second driving electrodes. For example, the electrode structure 20a may include four sub-driving electrodes OE21, OE22, OE23, and OE24 each having a ¼ ring form. When the four ¼ ring forms are connected, a ring shape may be formed. As illustrated in FIG. 16, the sub-driving electrodes OE21, OE22, OE23, and OE24 each having the ¼ ring form may be formed to be apart from each other by a predetermined distance.

Referring to FIG. 13 again, according to the method of manufacturing the micro-LED array according to an embodiment, the plurality of micro-LEDs 10, 11, and 12 may be bonded to all of the plurality of electrode structures 20, 21, and 22 of the second substrate 200. In this case, the first electrodes E1, E3, and E5 of the plurality of micro-LEDs 10, 11, and 12 may be electrically connected with the first driving electrodes of the plurality of electrode structures 20, 21, and 22, respectively. Also, the at least one second electrode E2, E4, or E6 of each of the plurality of micro-LEDs 10, 11, and 12 may be electrically connected with the second driving electrode of each of the plurality of electrode structures 20, 21, and 22. Here, that the electrodes are electrically connected with each other may denote that the electrodes may contact each other. Simultaneously, the first electrodes E1, E3, and E5 respectively of the plurality of micro-LEDs 10, 11, and 12 may not be electrically connected with the second driving electrodes of the plurality of electrode structures 20, 21, and 22, respectively. Also, the second electrodes E2, E4, and E5 of the plurality of micro-LEDs 10, 11, and 12 may not be electrically connected with the first driving electrodes of the plurality of electrode structures 20, 21, and 22, respectively.

Referring to FIG. 17, according to the method of manufacturing the micro-LED array according to an embodiment, a micro-LED array 1000, in which the plurality of micro-LEDs 10, 11, and 12 are respectively bonded to the plurality of electrode structures 20, 21, and 22, may be formed. FIG. 17 illustrates that all of the plurality of micro-LEDs 10, 11, and 12 are arranged to be parallel with the plurality of electrode structures 20, 21, and 22. However, it is not limited thereto. For example, at least two of the plurality of micro-LEDs 10, 11, and 12 may be arranged with respect to at least two of the plurality of electrode structures 20, 21, and 22 in different directions from each other.

Referring to FIGS. 18 and 19, according to the method of manufacturing the micro-LED array according to an embodiment, when the first substrate 110 and the second substrate 200 are arranged to face each other, any one of the plurality of micro-LEDs 10 and any one of the plurality of electrode structures 20 may slightly go across each other. However, in this case also, the first electrode E1 may not be electrically connected with the second driving electrode OE2, and the second electrode E2 may not be electrically connected with the first driving electrode OE1. That may be because the first electrode E1 and the second electrode E2 are apart from each other, and the first driving electrode OE1 and the second driving electrode OE2 are apart from each other.

Figure 20:
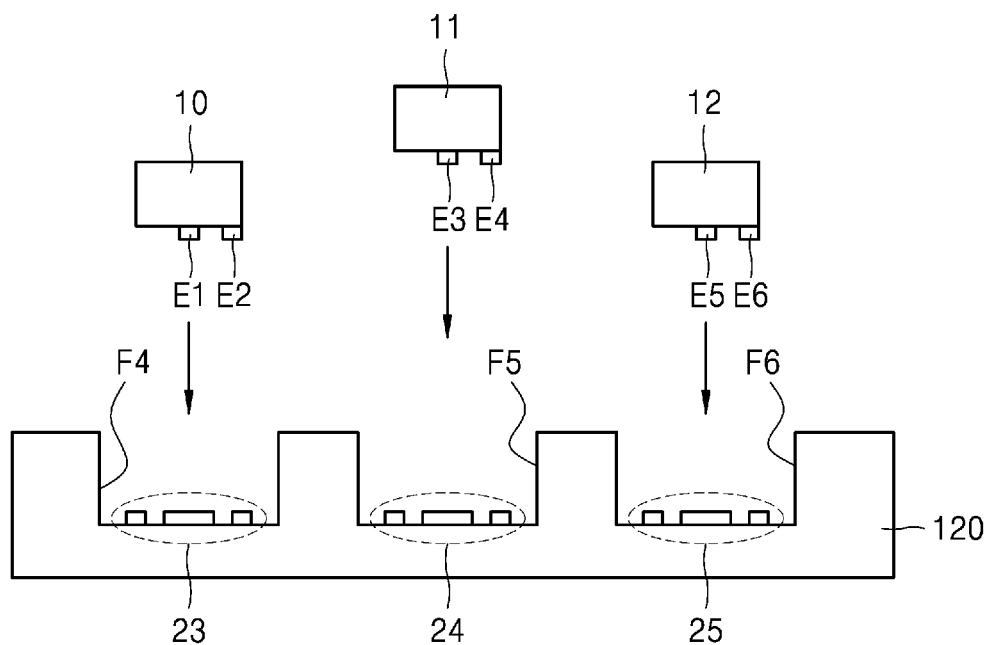
FIG. 20 is a schematic diagram of a process in which a plurality of micro-LEDs are aligned on a first substrate in a method of manufacturing a micro-LED array, according to another embodiment.
Figure 21:
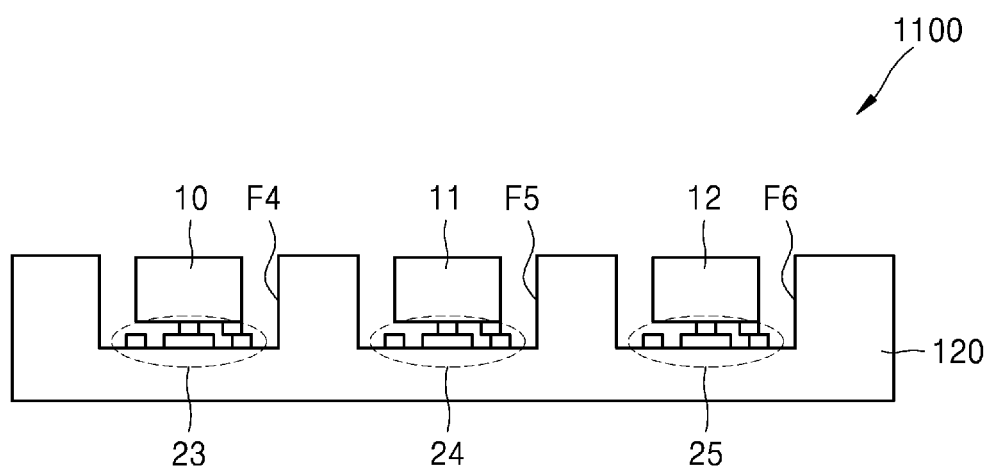
FIG. 21 is a schematic diagram of a structure of a micro-LED array formed according to the method of manufacturing a micro-LED array of FIG. 20.
Figure 22:
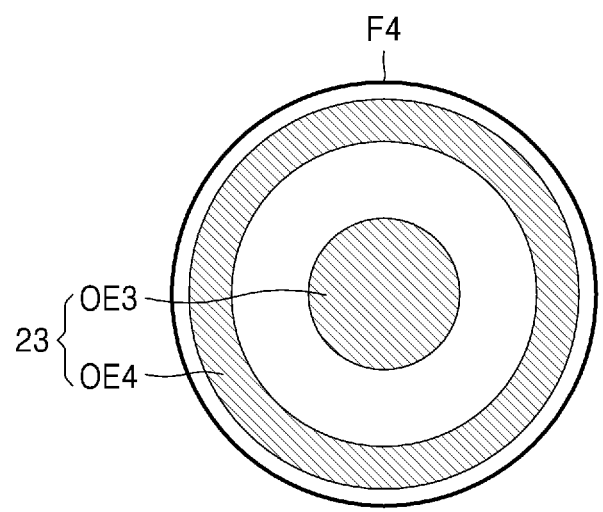
FIG. 22 is a schematic diagram of a structure of an electrode structure that is provided in a circular groove of a first substrate, according to an embodiment.
Figure 23:
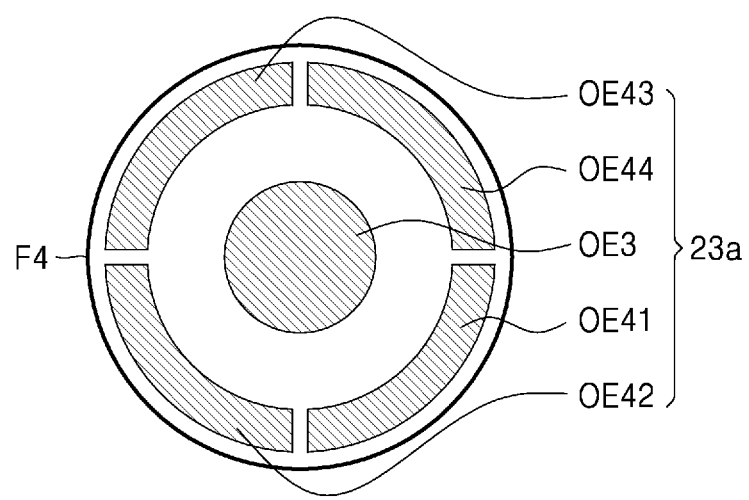
FIG. 23 is a schematic diagram of a structure of an electrode structure that may be provided in a circular groove of a first substrate, according to another embodiment.

FIG. 20 is a schematic diagram for illustrating a process in which the plurality of micro-LEDs 10, 11, and 12 are aligned on a first substrate 120, according to a method of manufacturing a micro-LED array, according to another embodiment. FIG. 21 is a schematic diagram of a structure of a micro-LED array 1100 manufactured according to the method of manufacturing the micro-LED array of FIG. 20. FIG. 22 is a schematic diagram of a structure of an electrode structure 23 provided in a circular groove F4 of the first substrate 120, according to an embodiment. FIG. 23 is a schematic diagram of a structure of the electrode structure 23a provided in the circular groove F4 of the first substrate 120, according to another embodiment.

The method of manufacturing the micro-LED array of FIG. 20 may be substantially the same as the method of manufacturing the micro-LED array described with reference to FIGS. 1 through 19, except that, in the method of FIG. 18, a plurality of electrode structures 23, 24, and 25 may be formed on the first substrate 120, rather than the second substrate 200 (FIG. 13), and the micro-LEDs 10, 11, and 12 may not be bonded after the first substrate 100 (FIG. 13) and the second substrate 200 are arranged to face each other, rather, the micro-LEDs 10, 11, and 12 may be directly provided on the first substrate 120. When describing FIG. 20, aspects that are the same as those of FIGS. 1 through 19 are omitted.

Referring to FIG. 20, the method of manufacturing the micro-LED array according to an embodiment may include supplying the plurality of micro-LEDs 10, 11, and 12 on the first substrate 120 including a plurality of circular grooves F4, F5, and F6. The first substrate 120 may include, for example, a mold substrate.

In this case, the first substrate 120 may include the plurality of electrode structures 23, 24, and 25 provided in the plurality of circular grooves F4, F5, and F6, respectively. Also, the aligning of the plurality of micro-LEDs 10, 11, and 12 with the plurality of circular grooves F4, F5, and F6 may include arranging two or more electrodes E1, E2, E3, E4, E5, and E6 respectively formed on the plurality of micro-LEDs 10, 11, and 12 toward the plurality of electrode structures 23, 24, and 25 respectively formed in the plurality of circular grooves F4, F5, and F6. Accordingly, as illustrated in FIG. 21, the micro-LED array 1100, in which the plurality of micro-LEDs 10, 11, and 12 are respectively bonded to the plurality of electrode structures 23, 24, and 25 of the first substrate 120, may be formed.

Referring to FIG. 22, the first electrode structure 23, which is any one of the plurality of electrode structures 23, 24, and 25 and provided in the first circular groove F4 from among the plurality of circular grooves F4, F5, and F6, may include a first driving electrode OE3 and a second driving electrode OE4 arranged to be apart from the first driving electrode OE3 and surrounding the first driving electrode OE3. The first electrode structure 23 including the first driving electrode OE3 and the second driving electrode OE4 may be formed to have rotational symmetry at all angles. For example, the first driving electrode OE3 may be circular, and the second driving electrode OE4 may have a ring shape to surround the circular first driving electrode OE3 in a circumferential direction. However, the first driving electrode OE3 is not limited to the circular shape. The first driving electrode OE3 may be polygonal, for example, quadrangular, triangular, rectangular, etc. In this case, while the second driving electrode OE4 may have the rotational symmetry at all angles, the first driving electrode OE3 may not have the rotational symmetry at all angles. The shape of the first electrode structure 23 may be applied to the second electrode structure 24 and the third electrode structure 25.

Referring to FIG. 23, according to another embodiment, any one of the plurality of electrode structures 23a which may be provided in the first circular groove F4 from among the plurality of circular grooves F4, F5, and F6 may include the first driving electrode OE3 and two or more sub-driving electrodes OE41, OE42, OE53, and OE54 apart from each other and apart from the first driving electrode OE3 and surround the first driving electrode OE3. In this case, the two or more sub-driving electrodes OE41, OE42, OE43, and OE44 may be referred to as second driving electrodes. For example, the plurality of electrode structure 23a may include four sub-driving electrodes OE41, OE42, OE43, and OE44 each having a ¼ ring form. When the four ¼ ring forms are connected, a ring shape may be formed. As illustrated in FIG. 23, the sub-driving electrodes OE41, OE42, OE43, and OE44 each having the ¼ ring form may be formed to be apart from each other by a predetermined distance. The shape of the plurality of electrode structures 23a of FIG. 23 may be applied to the plurality of electrode structures 23, 24, and 25 of FIG. 21.

Figure 24:
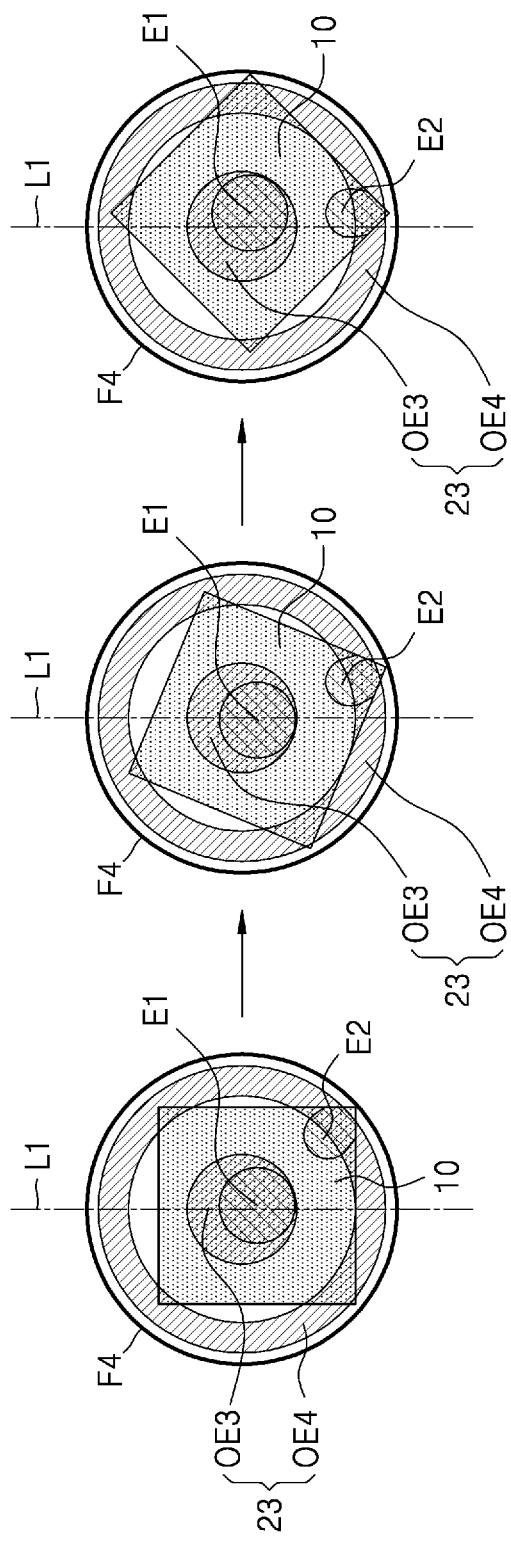
FIG. 24 is a schematic plan view of structures of any one of a plurality of circular grooves included in the micro-LED array of FIG. 21 and any one of a plurality of micro-LEDs provided in any one of the plurality of circular grooves.

FIG. 24 is a schematic plan view of a structure of any one of the plurality of circular grooves F4, F5, and F6 included in the micro-LED array 1100 of FIG. 21 and a structure of any one of the plurality of micro-LEDs 10, 11, and 12 provided in the one of the plurality of circular grooves F4, F5, and F6.

Referring to FIG. 24, the electrode structure 23 including the first driving electrode OE3 and the second driving electrode OE4 may be provided in the first circular groove F4 of the plurality of circular grooves F4, F5, and F6 included in the micro-LED array 1100 of FIG. 21. Also, from among the plurality of micro-LEDs 10, 11, and 12, the first micro-LED 10 may be provided in the first circular groove F4.

The first electrode E1 of the first micro-LED 10 may be electrically connected to the first driving electrode OE3. Also, the second electrode E2 of the first micro-LED 10 may be electrically connected to the second driving electrode OE4. In this case, the electrode structure 23 may be formed to have the rotational symmetry at all angles, and thus, when the first micro-LED 10 is arranged in the first circular groove F4 at any angle, the first electrode E1 may be electrically connected with the first driving electrode OE3, and the second electrode E2 may be electrically connected with the second driving electrode OE4.

For example, as illustrated in FIG. 24, when the first micro-LED 10 is arranged to be symmetrical with respect to any reference line L1 crossing a center of the first circular groove F4 (a state illustrated in the first figure from the left), the first electrode E1 may be electrically connected with the first driving electrode OE3, and the second electrode E2 may be electrically connected with the second driving electrode OE4. Also, when the first micro-LED 10 is clockwise rotated by about 22.5 degrees from the state in which the first micro-LED 10 is symmetrical with respect to the reference line L1 (a state illustrated in the second figure from the left), the first electrode E1 may be electrically connected with the first driving electrode OE3, and the second electrode E2 may be electrically connected with the second driving electrode OE4. Also, when the first micro-LED 10 is clockwise rotated by about 45 degrees from the state in which the first micro-LED 10 is symmetrical with respect to the reference line L1 (a state illustrated in the third figure from the left side), the first electrode E1 may be electrically connected with the first driving electrode OE3, and the second electrode E2 may be electrically connected with the second driving electrode OE4.

Figure 25:
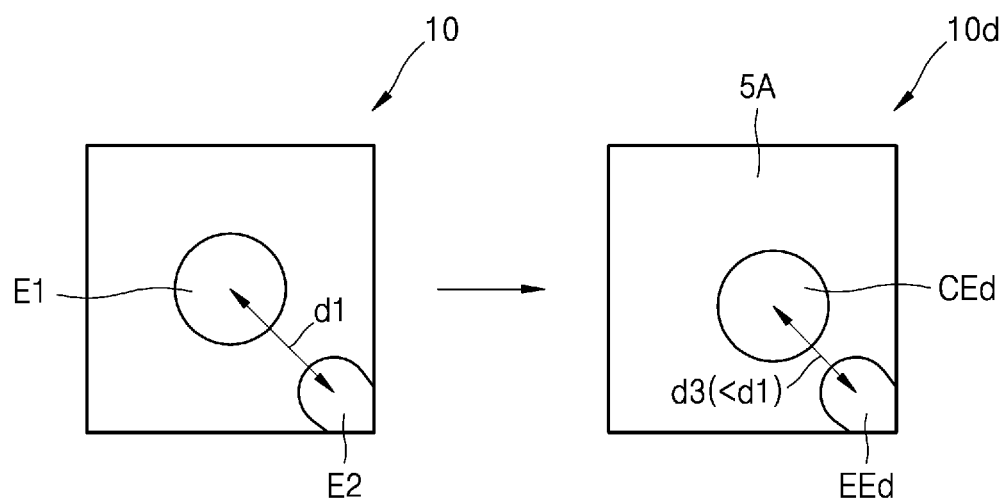
FIG. 25 is a schematic diagram of a structure of a plurality of micro-LEDs, which may be applied to the micro-LED array of FIG. 21, according to various embodiments.

FIG. 25 is a schematic diagram of structures of a plurality of micro-LEDs 10 and 10d, which may be applied to the micro-LED array 1100 of FIG. 21, according to various embodiments. The structure of the plurality of micro-LEDs 10 illustrated on the left side of FIG. 25 may be the same as illustrated in FIG. 3. Thus, hereinafter, the plurality of micro-LEDs 10d illustrated on the right side of FIG. 25 will be described.

Referring to FIG. 25, each of the plurality of micro-LEDs 10d may include at least two electrodes CEd and EEd formed to be apart from each other on a second surface 5A thereof. The at least two electrodes CEd and EEd may include a conductive material, such as metal, etc. However, the at least two electrodes CEd and EEd are not limited thereto and may include various conductive materials, in addition to metal. The second surface 5A of each of the plurality of micro-LEDs 10d, on which the at least two electrodes CEd and EEd are provided, may have a polygonal shape. For example, the second surface 5A of each of the plurality of micro-LEDs 10d, on which the at least two electrodes CEd and EEd are provided, may have a square shape. However, the second surface 5A of each of the plurality of micro-LEDs 10d, on which the at least two electrodes CEd and EEd are provided, is not limited thereto.

The at least two electrodes CEd and EEd may include a first electrode CEd provided to be relatively close to a center of the second surface 5A of each of the plurality of micro-LEDs 10d and at least one second electrode EEd provided at an edge of the second surface 5A of each of the plurality of micro-LEDs 10d. For example, as illustrated in FIG. 25, the first electrode CEd may be provided at a position that is slightly apart, by a predetermined distance, from the center of the second surface 5A of each of the plurality of micro-LEDs 10d toward a corner area. Also, as illustrated in FIG. 25, the at least one second electrode EEd may be provided at a corner area of the second surface 5A of each of the plurality of micro-LEDs 10d. In this case, a distance d3 between a center of the first electrode CEd and a center of the second electrode EEd may be less than the distance d1 between the center of the first electrode E1 and the center of the second electrode E2 of FIG. 3. In this case, since the distance d3 between the first electrode CEd and the second electrode EEd is reduced, a movement path of electrons may be minimized.

Figure 26:
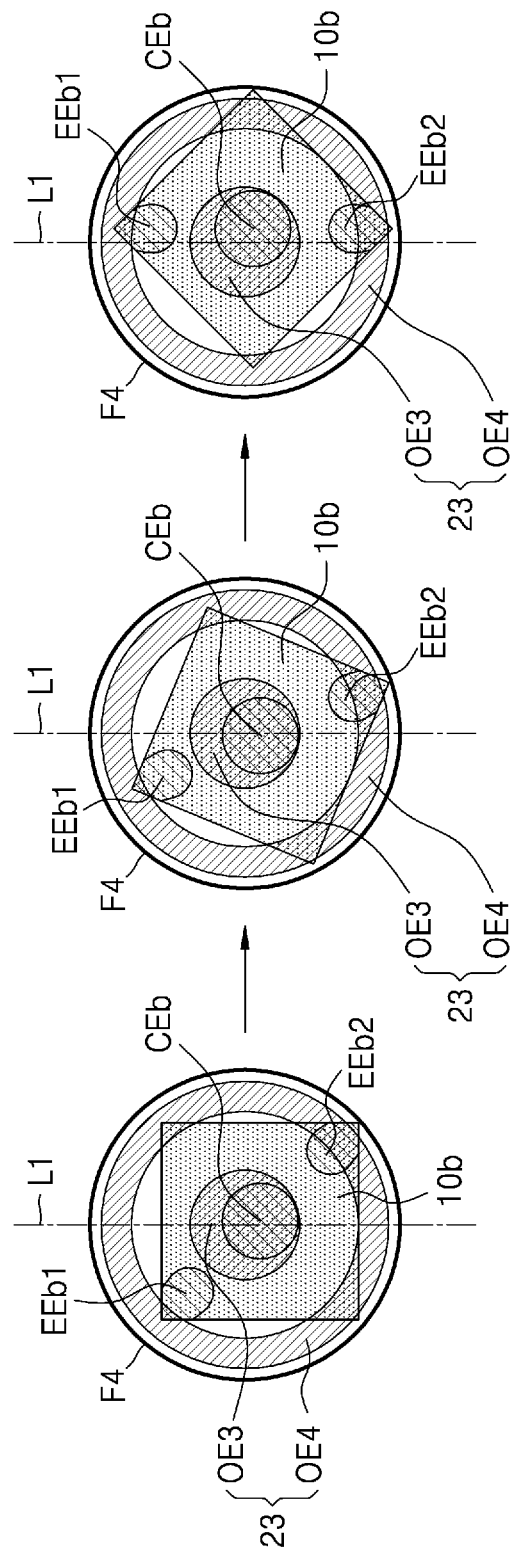
FIG. 26 is a schematic plan view of a shape in which a plurality of micro-LEDs, which may be applied to the micro-LED array of FIG. 21, are provided in any one of a plurality of circular grooves.

FIG. 26 is a schematic plan view of a shape in which the plurality of micro-LEDs 10b, which may be applied to the micro-LED array 1100 of FIG. 21, are provided in any one of the plurality of circular grooves F4, F5, and F6. The plurality of micro-LEDs 10b are the same as described with reference to FIG. 7, and thus, hereinafter, the shape in which the plurality of micro-LEDs 10b are provided in the one of the plurality of circular grooves F4, F5, and F6 will be described.

Referring to FIG. 26, the electrode structure 23 including the first driving electrode OE3 and the second driving electrode OE4 may be provided in the first circular groove F4 from among the plurality of circular grooves F4, F5, and F6 included in the micro-LED array 1100 of FIG. 21. Also, any one of the plurality of micro-LEDs 10b may be provided in the first circular groove F4.

The first electrode CEb of the one of the plurality of micro-LEDs 10b may be electrically connected with the first driving electrode OE3. Also, the second electrodes EEb1 and EEb2 of the one of the plurality of micro-LEDs 10b may be electrically connected with the second driving electrode OE4. In this case, the electrode structure 23 may be formed to have the rotational symmetry at all angles, and thus, when any one of the plurality of micro-LEDs 10b is arranged in the first circular groove F4 at any angle, the first electrode CEb may be electrically connected with the first driving electrode OE3, and the second electrodes EEb1 and EEb2 may be electrically connected with the second driving electrode OE4.

For example, as illustrated in FIG. 26, when the one of the plurality of micro-LEDs 10b is arranged to be symmetrical with respect to any reference line L1 crossing a center of the first circular groove F4 (a state illustrated in the first figure from the left), the first electrode CEb may be electrically connected with the first driving electrode OE3, and the second electrodes EEb1 and EEb2 may be electrically connected with the second driving electrode OE4. Also, when the one of the plurality of micro-LEDs 10b is clockwise rotated by about 22.5 degrees from the state in which the one of the plurality of micro-LEDs 10b is symmetrical with respect to the reference line L1 (a state illustrated in the second figure from the left), the first electrode CEb may be electrically connected with the first driving electrode OE3, and the second electrodes EEb1 and EEb2 may be electrically connected with the second driving electrode OE4. Also, when the one of the plurality of micro-LEDs 10b is clockwise rotated by about 45 degrees from the state in which the one of the plurality of micro-LEDs 10b is symmetrical with respect to the reference line L1 (a state illustrated in the third figure from the left side), the first electrode CEb may be electrically connected with the first driving electrode OE3, and the second electrodes EEb1 and EEb2 may be electrically connected with the second driving electrode OE4.

Figure 27A:
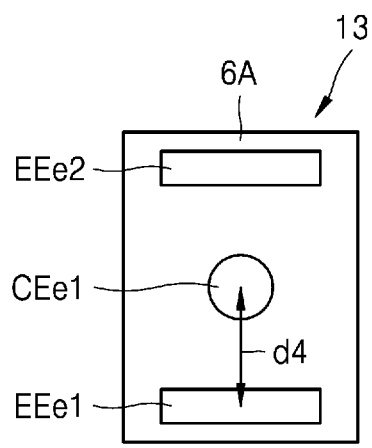
FIGS. 27A-27C are schematic diagrams of structures of a plurality of micro-LEDs which may be applied to the micro-LED array of FIG. 21, according to various embodiments.
Figure 27B:
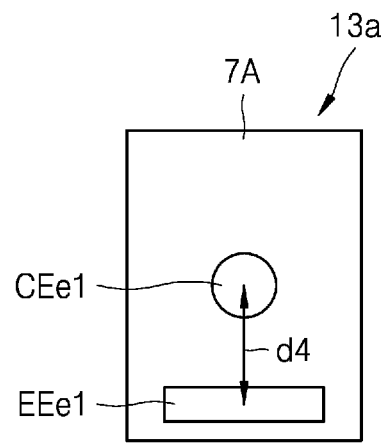
Figure 27C:
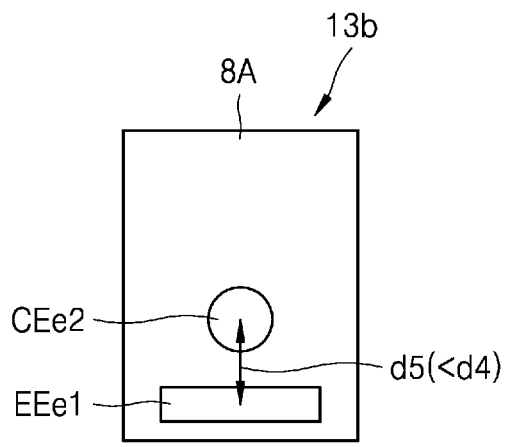

FIGS. 27A through 27C are schematic diagrams of structures of a plurality of micro-LEDs 13, 13a, and 13b, which may be applied to the micro-LED array 1100 of FIG. 21, according to various embodiments.

Referring to FIG. 27A, according to an embodiment, the micro-LED 13 may include two or more electrodes CEe1, EEe1, and EEe2 formed on a second surface 6A thereof to be apart from each other. The two or more electrodes CEe1, EEe1, and EEe2 may include a conductive material, such as metal, etc. However, the two or more electrodes CEe1, EEe1, and EEe2 are not limited thereto and may include various other conductive materials than metal. The second surface 6A of the micro-LED 13, on which the two or more electrodes CEe1, EEe1, and EEe2 are provided, may have a polygonal shape. For example, the second surface 6A of the micro-LED 13, on which the two or more electrodes CEe1, EEe1, and EEe2 are provided, may have a rectangular shape.

The two or more electrodes CEe1, EEe1, and EEe2 may include a first electrode CEe1 provided to be relatively close to a center of the second surface 6A of the micro-LED 13 and one or more second electrodes EEe1 and EEe2 provided at edges of the second surface 6A of the micro-LED 13. For example, as illustrated in FIG. 27A, the first electrode CEe1 may be provided at the center of the second surface 6A of the micro-LED 13. Also, as illustrated in FIG. 27A, the one or more second electrodes EEe1 and EEe2 may be provided at edge areas of the second surface 6A of the micro-LED 13, the edge areas facing each other. For example, the first electrode CEe1 and the one or more second electrodes EEe1 and EEe2 may be arranged in a row on the straight line passing through the center of the second surface 6A of the micro-LED 13.

Referring to FIG. 27B, the micro-LED 13a may be substantially the same as the micro-LED 13 of FIG. 27A, except that the micro-LED 13a of FIG. 25B includes only one second electrode EEe1 on a second surface 7A thereof. Accordingly, an emission area of the micro-LED 13a may be relatively greater than an emission area of the micro-LED 13 of FIG. 27A.

Referring to FIG. 27C, the micro-LED 13b may be substantially the same as the micro-LED 13a of FIG. 27B, except that, in the micro-LED 13b of FIG. 27C, a distance d5 between the first electrode CEe2 and the second electrode EEe1 is relatively less than distance d4 of the micro-LED 13a of FIG. 27B. For example, the first electrode CEe2 may be provided to be apart, by a predetermined distance, from the center of a second surface 8A of the micro-LED 13b toward an edge area.

Figure 28A:
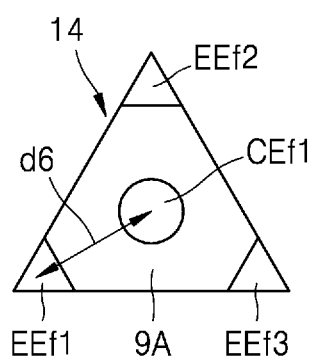
FIGS. 28A-28C are schematic diagrams of structures of a plurality of micro-LEDs which may be applied to the micro-LED array of FIG. 21, according to various embodiments.
Figure 28B:
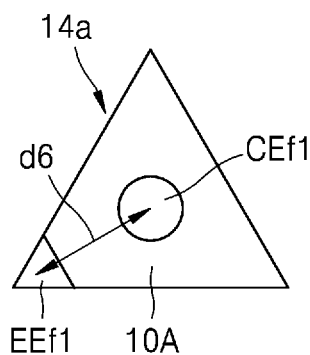
Figure 28C:
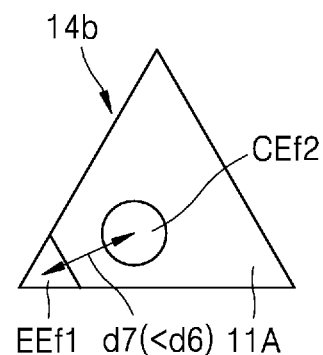

FIGS. 28A through 28C are schematic diagrams of a structure of a plurality of micro-LEDs 14, 14a, and 14b, which may be applied to the micro-LED array 1100 of FIG. 21, according to various embodiments.

Referring to FIG. 28A, according to an embodiment, the micro-LED 14 may include two or more electrodes CEf1, EEf1, EEf2, and EEf3 formed on a second surface 9A thereof to be apart from each other. The two or more electrodes CEf1, EEf1, EEf2, and EEf3 may include a conductive material, such as metal, etc. However, the two or more electrodes CEf1, EEf1, EEf2, and EEf3 are not limited thereto and may include various other conductive materials than metal. The second surface 9A of the micro-LED 14, on which the two or more electrodes CEf1, EEf1, EEf2, and EEf3 are provided, may have a polygonal shape. For example, the second surface 9A of the micro-LED 14, on which the two or more electrodes CEf1, EEf1, EEf2, and EEf3 are provided, may have an equilateral triangular shape.

The two or more electrodes CEf1, EEf1, EEf2, and EEf3 may include a first electrode CEf1 provided to be relatively close to a center of the second surface 9A of the micro-LED 14 and one or more second electrodes EEf1, EEf2, and EEf3 provided at edges of the second surface 9A of the micro-LED 14. For example, as illustrated in FIG. 28A, the first electrode CEf1 may be provided at the center of the second surface 9A of the micro-LED 14. Also, as illustrated in FIG. 28A, the one or more second electrodes EEf1, EEf2, and EEf3 may be provided at corner areas of the surface of the micro-LED 14.

Referring to FIG. 28B, the micro-LED 14a may be substantially the same as the micro-LED 14 of FIG. 28A, except that the micro-LED 14a of FIG. 28B includes only one second electrode EEf1 on a second surface 10A thereof. Accordingly, an emission area of the micro-LED 14a may be relatively greater than an emission area of the micro-LED 14 of FIG. 28A.

Referring to FIG. 28C, the micro-LED 14b may be substantially the same as the micro-LED 14a of FIG. 28B, except that, in the micro-LED 14b of FIG. 28C, a distance d7 between the first electrode CEf2 and the second electrode EEf1 is relatively less than distance d6 of the micro-LED 14a of FIG. 28B. For example, the first electrode CEf2 may be provided to be apart, by a predetermined distance, from the center of a second surface 11A of the micro-LED 14b toward a corner area.

Figure 29A:
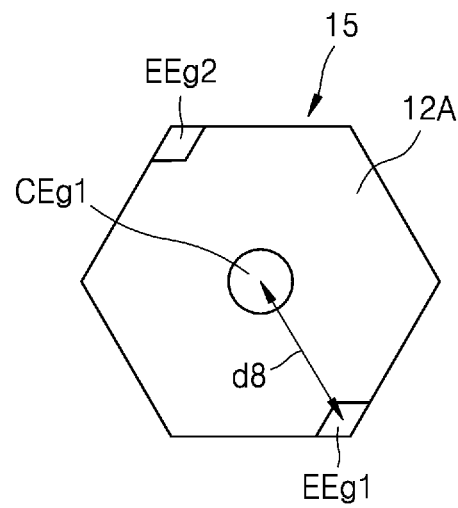
FIGS. 29A-29C are schematic diagrams of structures of a plurality of micro-LEDs which may be applied to the micro-LED array of FIG. 21, according to various embodiments.
Figure 29B:
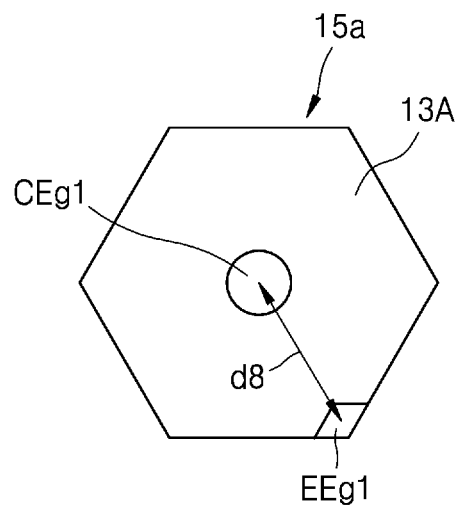
Figure 29C:
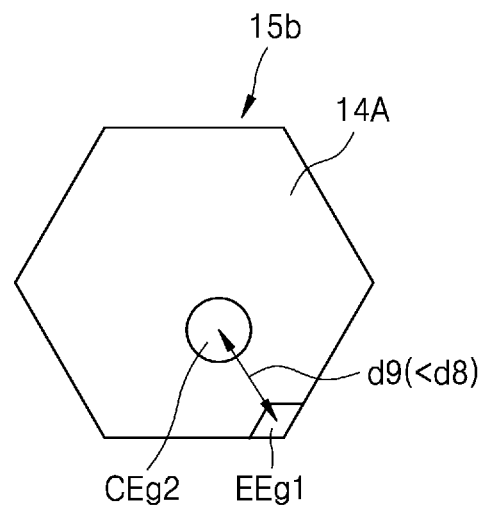

FIGS. 29A through 29C are schematic diagrams of structures of a plurality of micro-LEDs 15, 15a, and 15b, which may be applied to the micro-LED array 1100 of FIG. 19, according to various embodiments.

Referring to FIG. 29A, according to an embodiment, the micro-LED 15 may include two or more electrodes CEg1, EEg1, and EEg2 formed on a second surface 12A thereof to be apart from each other. The two or more electrodes CEg1, EEg1, and EEg2 may include a conductive material, such as metal, etc. However, the two or more electrodes CEg1, EEg1, and EEg2 are not limited thereto and may include various other conductive materials than metal. The second surface 12A of the micro-LED 15, on which the two or more electrodes CEg1, EEg1, and EEg2 are provided, may have a polygonal shape. For example, the second surface 12A of the micro-LED 15, on which the two or more electrodes CEg1, EEg1, and EEg2 are provided, may have a regular hexagonal shape.

The two or more electrodes CEg1, EEg1, and EEg2 may include a first electrode CEg1 provided to be relatively close to a center of the second surface 12A of the micro-LED 15 and one or more second electrodes EEg1 and EEg2 provided at edges of the second surface 12A of the micro-LED 15. For example, as illustrated in FIG. 29A, the first electrode CEg1 may be provided at the center of the second surface 12A of the micro-LED 15. Also, as illustrated in FIG. 29A, the one or more second electrodes EEg1 and EEg2 may be provided at corner areas of the second surface 12A of the micro-LED 15. For example, the first electrode CEg1 and the one or more second electrodes EEg1 and EEg2 may be arranged in a row on the straight line passing through the center of the second surface 12A of the micro-LED 15.

Referring to FIG. 29B, the micro-LED 15a may be substantially the same as the micro-LED 15 of FIG. 29A, except that the micro-LED 15a of FIG. 29B includes only one second electrode EEg1 on a second surface 13A thereof. Accordingly, an emission area of the micro-LED 15a may be relatively greater than an emission area of the micro-LED 15 of FIG. 29A.

Referring to FIG. 29C, the micro-LED 15b may be substantially the same as the micro-LED 15a of FIG. 29B, except that, in the micro-LED 15b of FIG. 29C, a distance d9 between the first electrode CEg2 and the second electrode EEg1 is relatively less than distance d8 of the micro-LED 15a of FIG. 29B. For example, the first electrode CEg2 may be provided to be apart, by a predetermined distance, from the center of a second surface 14A of the micro-LED 15b toward a corner area.

Figure 30A:
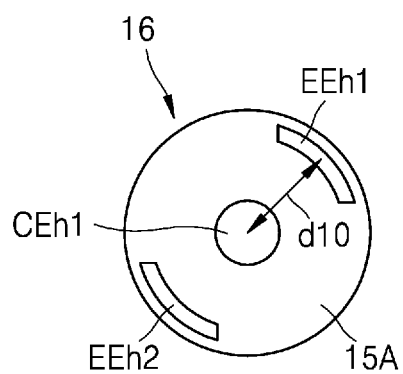
FIGS. 30A-30C are schematic diagrams of structures of a plurality of micro-LEDs which may be applied to the micro-LED array of FIG. 21, according to various embodiments.
Figure 30B:
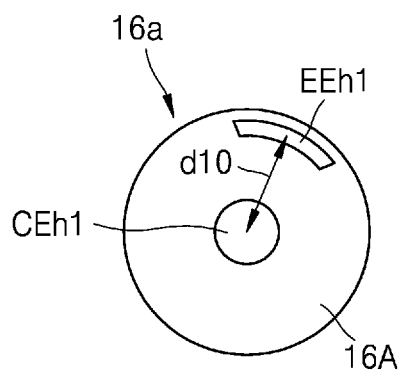
Figure 30C:
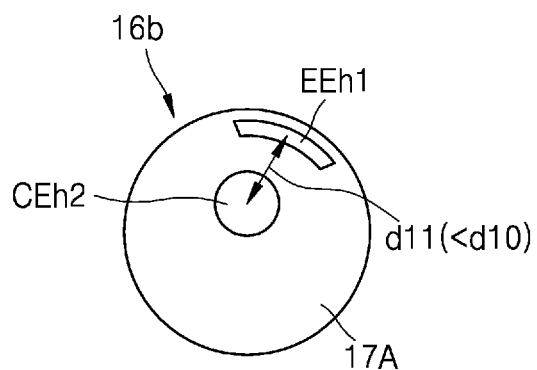

FIGS. 30A through 30C are schematic diagrams of a structure of a plurality of micro-LEDs 16, 16a, and 16b, which may be applied to the micro-LED array 1100 of FIG. 21, according to various embodiments.

Referring to FIG. 30A, according to an embodiment, the micro-LED 16 may include two or more electrodes CEh1, EEh1, and EEh2 formed on a second surface 15A thereof to be apart from each other. The two or more electrodes CEh1, EEh1, and EEh2 may include a conductive material, such as metal, etc. However, the two or more electrodes CEh1, EEh1, and EEh2 are not limited thereto and may include various other conductive materials than metal. The second surface 15A of the micro-LED 16, on which the two or more electrodes CEh1, EEh1, and EEh2 are provided, may have a circular shape.

The two or more electrodes CEh1, EEh1, and EEh2 may include a first electrode CEh1 provided to be relatively close to a center of the second surface 15A of the micro-LED 16 and one or more second electrodes EEh1 and EEh2 provided at edges of the second surface 15A of the micro-LED 16. For example, as illustrated in FIG. 30A, the first electrode CEh1 may be provided at the center of the second surface 15A of the micro-LED 16. Also, as illustrated in FIG. 30A, the one or more second electrodes EEh1 and EEh2 may be provided at edge areas of the second surface 15A of the micro-LED 16, the edge areas facing each other. For example, the first electrode CEh1 and the one or more second electrodes EEh1 and EEh2 may be arranged in a row on the straight line passing through the center of the second surface 15A of the micro-LED 16.

Referring to FIG. 30B, the micro-LED 16a may be substantially the same as the micro-LED 16 of FIG. 30A, except that the micro-LED 16a of FIG. 28B includes only one second electrode EEh1 on a second surface 16A thereof. Accordingly, an emission area of the micro-LED 16a may be relatively greater than an emission area of the micro-LED 16 of FIG. 30A.

Referring to FIG. 30C, the micro-LED 16b may be substantially the same as the micro-LED 16a of FIG. 30B, except that, in the micro-LED 16b of FIG. 30C, a distance d11 between the first electrode CEh2 and the second electrode EEh1 is relatively less than distance d10 of the micro-LED 16a of FIG. 30B. For example, the first electrode CEh2 may be provided to be apart, by a predetermined distance, from the center of a second surface 17A of the micro-LED 16b toward a corner area.

Figure 31:
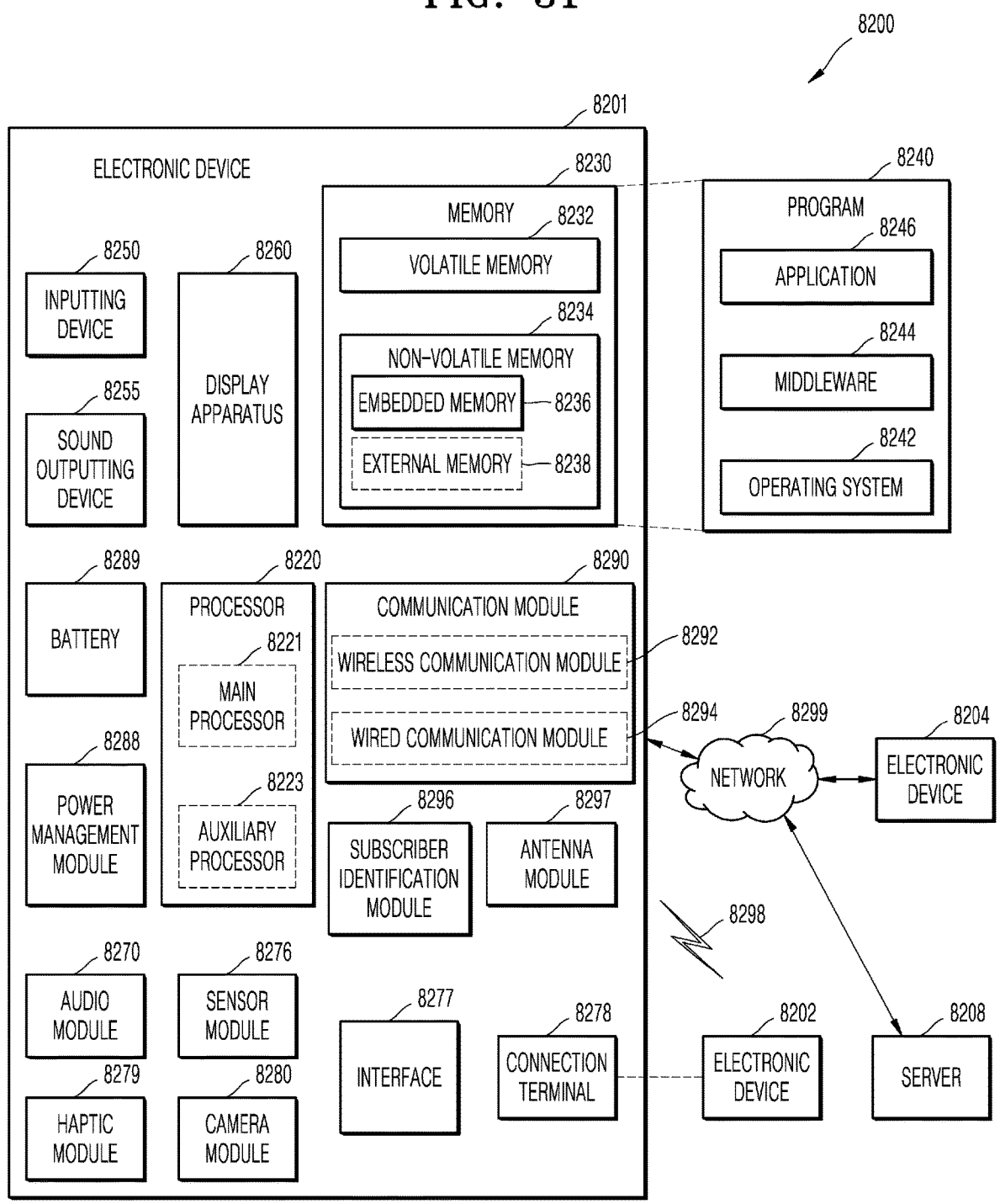
FIG. 31 is a block diagram of an electronic device including a display apparatus, according to an embodiment.

FIG. 31 is a block diagram of an electronic device 8201 including a display apparatus, according to an embodiment.

Referring to FIG. 31, the electronic device 8201 may be provided in a network environment 8200. In the network environment 8200, the electronic device 8201 may communicate with another electronic device 8202 through a first network 8298 (a short-range wireless communication network, etc.) or with another electronic device 8204 and/or a server 8208 through a second network 8299 (a remote wireless communication network, etc.). The electronic device 8201 may communicate with the electronic device 8204 through the server 8208. The electronic device 8201 may include a processor 8220, a memory 8230, an inputting device 8250, a sound outputting device 8255, a display apparatus 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. The electronic device 8201 may omit one or more of these components or may further include other components. One or more of these components may be implemented as an integrated circuit. For example, the sensor module 8276 (a fingerprint sensor, an iris sensor, an illuminance sensor, etc.) may be embedded in the display apparatus 8260 (a display, etc.)

The processor 8220 may execute software (a program 8240, etc.) to control one or more components (hardware, software, etc.) of the electronic device 8201 connected to the processor 8220 and to perform various data processing or computation operations. As part of the data processing or computation operations, the processor 8220 may be configured to load a command and/or data received from other components (the sensor module 8276, the communication module 8290, etc.) into a volatile memory 8232, process the command and/or the data stored in the volatile memory 8232, and store resulting data in a non-volatile memory 8234. The processor 8220 may include a main processor 8221 (a central processing unit, an application processor, etc.) and an auxiliary processor 8223 (a graphics processing unit, an image signal processor, a sensor-hub processor, a communication processor, etc.) which may operate separately from or together with the main processor 8221. The auxiliary processor 8223 may use less power than the main processor 8221 and may perform specialized functions.

The auxiliary processor 8223 may operate instead of the main processor 8221, when the main processor 8221 is in an inactive state (a sleep state), may operate together with the main processor 8221, when the main processor 8221 is in an active state (an application execution state), and may control a function and/or a state associated with one or more components (the display apparatus 8260, the sensor module 8276, the communication module 8290, etc.) of the electronic device 8201. The auxiliary processor 8223 (the image signal processor, the communication processor, etc.) may be implemented as part of other functionally related components (the camera module 8280, the communication module 8290, etc.).

The memory 8230 may store various data required by the components (the processor 8220, the sensor module 8276, etc.) of the electronic device 8201. The data may include, for example, the software (the program 8240, etc.), and input data and/or output data with respect to a command related to the software. The memory 8230 may include the volatile memory 8232 and/or the non-volatile memory 8234.

The program 8240 may be stored in the memory 8230 as software and may include an operating system 8242, middle ware 8244, and/or an application 8246.

The inputting device 8250 may receive a command and/or data to be used for the components (the processor 8220, etc.) of the electronic device 8201, from the outside (a user, etc.) of the electronic device 8201. The inputting device 8250 may include a remote controller, a microphone, a mouse, a keyboard, and/or a digital pen (a stylus pen, etc.).

The sound outputting device 8255 may output a sound signal to the outside of the electronic device 8201. The sound outputting device 8255 may include a speaker and/or a receiver. The speaker may be used for a general purpose, such as reproducing multimedia content or recording content, and the receiver may be used to receive an incoming call. The receiver may be integrated as part of the speaker or separately provided from the speaker.

The display apparatus 8260 may visually provide data to the outside of the electronic device 8201. The display apparatus 8260 may include a display, a hologram device, or a control circuit configured to control a projector and a corresponding device. The display apparatus 8260 may include a micro-LED display apparatus. For example, the display apparatus 8260 may include various types of display apparatuses including the micro-LED array 1000 or 1100 described with reference to FIGS. 1 through 30. The display apparatus 8260 may include touch circuitry configured to sense a touch operation and/or sensor circuitry (a pressure sensor, etc.) configured to measure an intensity of a force generated by the touch operation.

The audio module 8270 may convert sound into an electrical signal or an electrical signal into sound. The audio module 8270 may obtain sound via the inputting device 8250 or may output sound via the sound outputting device 8255 and/or a speaker and/or a headphone of another electronic device (the electronic device 8202, etc.) directly or wirelessly connected to the electronic device 8201.

The sensor module 8276 may sense an operation state (power, temperature, etc.) of the electronic device 8201 or an external environmental state (a user state, etc.) and generate electrical signals and/or data values corresponding to the sensed state. The sensor module 8276 may include a gesture sensor, a gyro-sensor, an atmospheric sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more designated protocols to be used for the electronic device 8201 to be directly or wirelessly connected to another electronic device (the electronic device 8202, etc.). The interface 8277 may include a high-definition multimedia interface (HDMI) interface, a universal serial bus (USB) interface, an SD card interface, and/or an audio interface.

A connection terminal 8278 may include a connector, through which the electronic device 8201 may be physically connected to another electronic device (the electronic device 8202, etc.). The connection terminal 8278 may include an HDMI connector, a USB connector, an SD card connector, and/or an audio connector (a headphone connector, etc.).

The haptic module 8279 may convert an electrical signal into a mechanical stimulus (vibration, motion, etc.) or an electrical stimulus which is recognizable to a user via haptic or motion sensation. The haptic module 8279 may include a motor, a piezoelectric device, and/or an electrical stimulus device.

The camera module 8280 may capture a still image and a video. The camera module 8280 may include a lens assembly including one or more lenses, image sensors, image signal processors, and/or flashes. The lens assemblies included in the camera module 8280 may collect light emitted from an object, an image of which is to be captured.

The power management module 8288 may manage power supplied to the electronic device 8201. The power management module 8388 may be realized as part of a power management integrated circuit (PMIC).

The battery 8289 may supply power to the components of the electronic device 8201. The battery 8289 may include a non-rechargeable primary battery, rechargeable secondary battery, and/or a fuel battery.

The communication module 8290 may support establishment of direct (wired) communication channels and/or wireless communication channels between the electronic device 8201 and other electronic devices (the electronic device 8202, the electronic device 8204, the server 8208, etc.) and communication performance through the established communication channels. The communication module 8290 may include one or more communication processors separately operating from the processor 8220 (an application processor, etc.) and supporting direct communication and/or wireless communication. The communication module 8290 may include a wireless communication module 8292 (a cellular communication module, a short-range wireless communication module, a global navigation satellite system (GNSS) communication module, and/or a wired communication module 8294 (a local area network (LAN) communication module, a power line communication module, etc.). From these communication modules, a corresponding communication module may communicate with other electronic devices through the first network 8298 (a short-range wireless communication network, such as Bluetooth, Wifi direct, or infrared data association (IrDa)) or the second network 8299 (a remote communication network, such as a cellular network, the Internet, or a computer network (LAN, WAN, etc.)). Various types of communication modules described above may be integrated as a single component (a single chip, etc.) or realized as a plurality of components (a plurality of chips). The wireless communication module 8292 may identify and authenticate the electronic device 8201 within the first network 8298 and/or the second network 8299 by using subscriber information (international mobile subscriber identification (IMSI), etc.) stored in the subscriber identification module 8296.

The antenna module 8297 may transmit a signal and/or power to the outside (other electronic devices, etc.) or receive the same from the outside. The antenna may include an emitter including a conductive pattern formed on a substrate (a printed circuit board (PCB), etc.). The antenna module 8297 may include an antenna or a plurality of antennas. When the antenna module 8297 includes a plurality of antennas, an appropriate antenna which is suitable for a communication method used in the communication networks, such as the first network 8298 and/or the second network 8299, may be selected. Through the selected antenna, signals and/or power may be transmitted or received between the communication module 8290 and other electronic devices. In addition to the antenna, another component (a radio frequency integrated circuit (RFIC), etc.) may be included in the antenna module 8297.

One or more of the components of the electronic device 8201 may be connected to one another and exchange signals (commands, data, etc.) with one another, through communication methods performed among peripheral devices (a bus, general purpose input and output (GPIO), a serial peripheral interface (SPI), a mobile industry processor interface (MIPI), etc.).

The command or the data may be transmitted or received between the electronic device 8201 and another external electronic device 8204 through the server 8108 connected to the second network 8299. The other electronic devices 8202 and 8204 may be electronic devices that are homogeneous or heterogeneous types with respect to the electronic device 8201. All or part of operations performed in the electronic device 8201 may be performed by one or more of the other electronic devices 8202, 8204, and 8208. For example, when the electronic device 8201 has to perform a function or a service, instead of directly performing the function or the service, the one or more other electronic devices may be requested to perform part or all of the function or the service. The one or more other electronic devices receiving the request may perform an additional function or service related to the request and may transmit a result of the execution to the electronic device 8201. To this end, cloud computing, distribution computing, and/or client-server computing techniques may be used.

Figure 32:
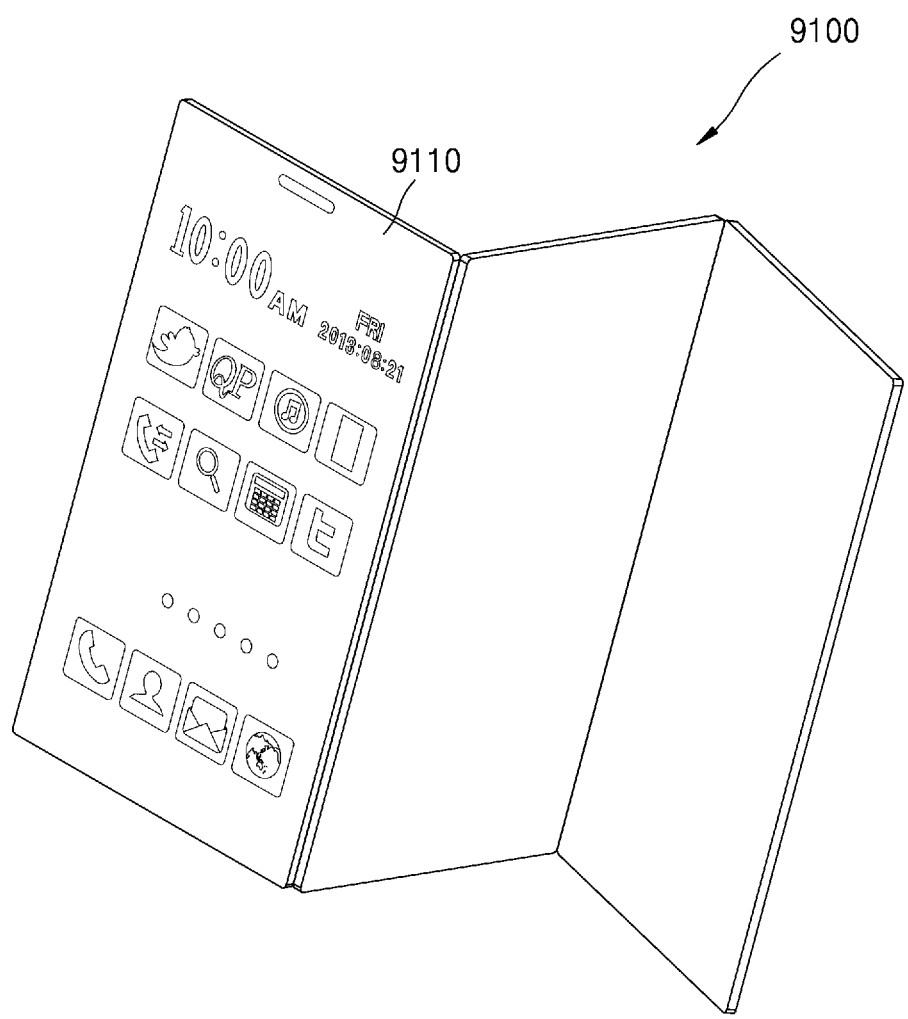
FIG. 32 is a diagram of an example in which an electronic device is applied to a mobile device, according to an embodiment.

FIG. 32 is a diagram of an example in which an electronic device is applied to a mobile device 9100, according to an embodiment.

Referring to FIG. 32, the mobile device 9100 may include a display apparatus 9110 according to an embodiment. The display apparatus 9110 may include a micro-LED display apparatus. For example, the display apparatus 9110 may include various types of display apparatuses including the micro-LED array 1000 or 1100 described with reference to FIGS. 1 through 30C. The display apparatus 9110 may have a foldable structure. For example, the display apparatus 9110 may include a multi-foldable display apparatus. Here, the mobile device 9100 is illustrated as a foldable display apparatus. However, the mobile device 9100 may also include a general flat display apparatus.

Figure 33:
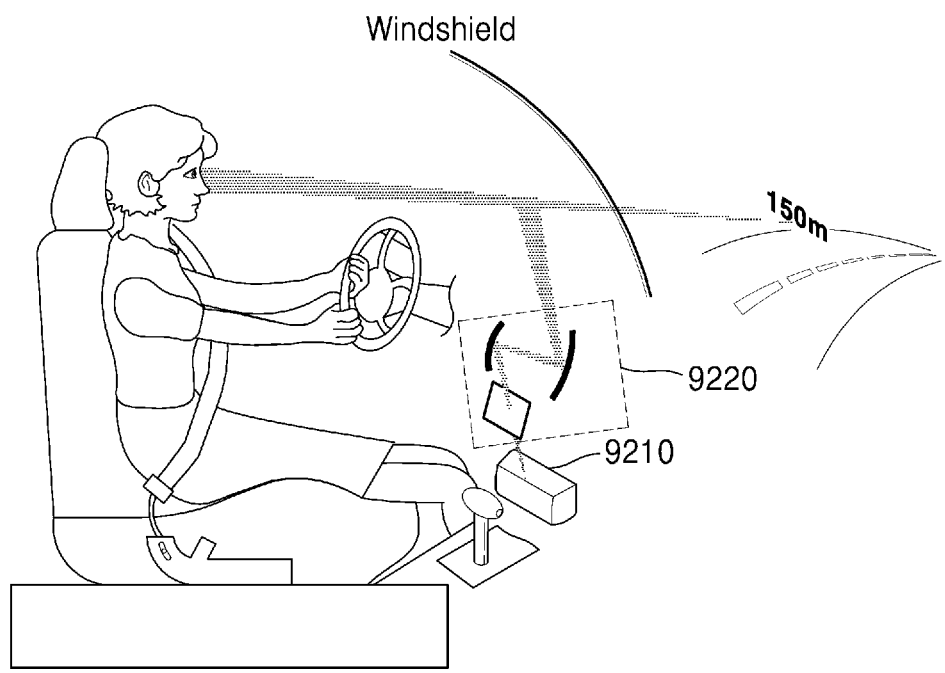
FIG. 33 is a diagram of an example in which a display apparatus is applied to a vehicle, according to an embodiment.

FIG. 33 is a diagram of an example in which a display apparatus is applied to a vehicle, according to an embodiment.

Referring to FIG. 33, the display apparatus may be applied to a vehicle head-up display apparatus 9200. The vehicle head-up display apparatus 9200 may include a display apparatus 9210 provided in a portion of the vehicle and at least one optical path-change member 9220 configured to convert an optical path for a driver to watch an image generated by the display apparatus 9210. The display apparatus 9210 may include a micro-LED display apparatus. For example, the display apparatus 9120 may include various types of display apparatuses including the micro-LED array 1000 or 1100 described with reference to FIGS. 1 through 30C.

Figure 34:
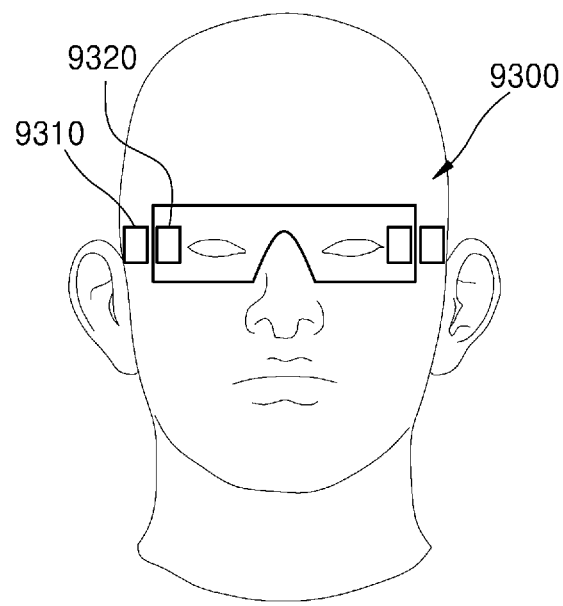
FIG. 34 is a diagram of an example in which a display apparatus is applied to augmented reality (AR) glasses or virtual reality (VR) glasses, according to an embodiment.

FIG. 34 is a diagram of an example in which a display apparatus is applied to augmented reality (AR) glasses 9300 or virtual reality (VR) glasses, according to an embodiment.

Referring to FIG. 34, the AR glasses 9300 may include a projection system 9310 configured to form an image and at least one component 9320 configured to guide an image from the projection system 9310 to the eye of a user. The projection system 9310 may include a micro-LED display apparatus. For example, the projection system 9310 may include various types of display apparatuses including the micro-LED array 1000 or 1100 described with reference to FIGS. 1 through 30C.

Figure 35:
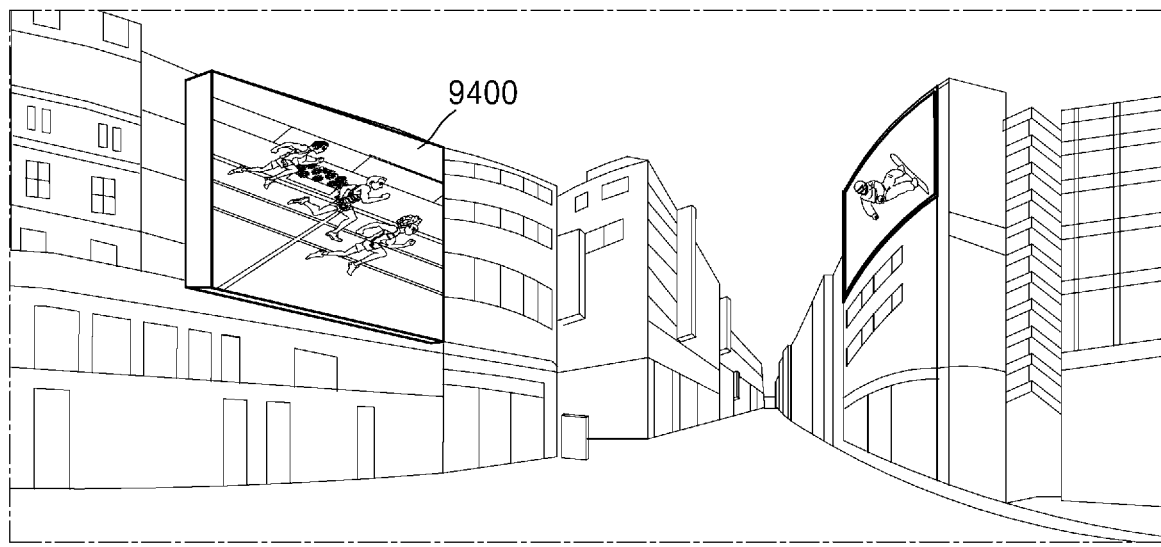
FIG. 35 is a diagram of an example in which a display apparatus is applied to a large signage, according to an embodiment.

FIG. 35 illustrates an example in which a display apparatus is applied to a large signage 9400, according to an embodiment.

Referring to FIG. 35, the signage 9400 may be used for outdoor advertising via a display of digital information and may control advertisement content, etc. through a communication network. The signage 9400 may be realized, for example, by the electronic device 8201 described with reference to FIG. 31.

Figure 36:
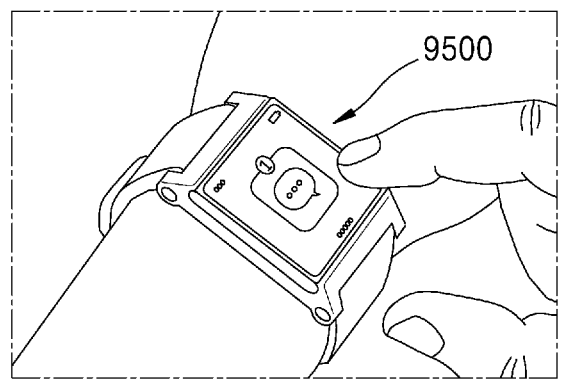
FIG. 36 is a diagram of an example in which a display apparatus is applied to a wearable display, according to an embodiment.

FIG. 36 is a diagram of an example in which a display apparatus is applied to a wearable display 9500, according to an embodiment.

Referring to FIG. 36, the wearable display 9500 may include the micro-LED array 1000 or 1100 described with reference to FIGS. 1 through 30C and may be realized via the electronic device 8201 described with reference to FIG. 31.

In addition, a display apparatus according to an embodiment may be applied to various products, such as a rollable television (TV), a stretchable display, etc.

The one or more embodiments described above are merely examples, and it may be understood to one of ordinary skill in the art that various modifications and equivalent other embodiments may be made therefrom. Thus, the technical scope of the one or more embodiments shall be defined by the technical concept of the disclosure described in the claims below.

The one or more embodiments provide a micro-LED array including a plurality of micro-LEDs and a driving circuit substrate including electrodes having appropriate structures for efficiently aligning the plurality of micro-LEDs on a substrate, and a method of manufacturing the micro-LED array.

According to the method of manufacturing the micro-LED array according to the one or more embodiments, grooves having the rotational symmetry at all angles may be formed in the substrate, and the plurality of micro-LEDs are aligned with the grooves. Thus, the micro-LEDs may be efficiently aligned.

According to the micro-LED array and the method of manufacturing the same according to the one or more embodiments, wafers for forming the plurality of micro-LEDs may be efficiently used, and thus, costs of the plurality of micro-LED arrays may be reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A method of manufacturing a micro-light-emitting diode (LED) array, the method comprising:
providing a first substrate including a plurality of circular grooves formed on a first surface thereof;
supplying a plurality of micro-LEDs onto the first surface of the first substrate;

providing a second substrate on which a plurality of electrode structures are formed to correspond to the plurality of circular grooves of the first substrate;

aligning the plurality of micro-LEDs with the plurality of circular grooves such that the plurality of circular grooves faces the plurality of electrode structures of the second substrate, and at least two electrodes formed on a second surface of each of the plurality of micro-LEDs are positioned toward upper openings of the plurality of circular grooves, wherein the at least two electrodes include a first electrode formed to be relatively close to a center of the second surface and at least one second electrode formed at an edge of the second surface.

2. The method of claim 1, wherein a size of each of the plurality of micro-LEDs is less than a size of each of the plurality of circular grooves included in the first substrate.

3. The method of claim 1, wherein the second surface has a polygonal shape.

4. The method of claim 1, further comprising:
bonding the plurality of micro-LEDs aligned with the plurality of circular grooves to the plurality of electrode structures.

5. The method of claim 4, wherein each of the plurality of electrode structures of the second substrate includes a first driving electrode and a second driving electrode formed to be apart from the first driving electrode and surrounding the first driving electrode.

6. The method of claim 5, wherein the second driving electrode has a ring shape.

7. The method of claim 5, wherein the second driving electrode includes at least two sub-driving electrodes that are apart from each other.

8. The method of claim 5, wherein the bonding of the plurality of micro-LEDs to the plurality of electrode structures includes electrically connecting the first electrode with the first driving electrode and electrically connecting the at least one second electrode with the second driving electrode.

9. The method of claim 8, wherein the aligning of the plurality of micro-LEDs with the plurality of circular grooves includes positioning the plurality of micro-LEDs such that the at least two electrodes formed in each of the plurality of micro-LEDs are positioned toward the plurality of electrode structures respectively provided in the plurality of circular grooves.

10. The method of claim 9, wherein each of the plurality of electrode structures of the first substrate includes a first driving electrode and a second driving electrode formed to be apart from the first driving electrode and surrounding the first driving electrode.

11. The method of claim 10, wherein the first electrode faces the first driving electrode and the at least one second electrode faces the second driving electrode.

12. The method of claim 10, wherein the second driving electrode has a ring shape.

13. The method of claim 10, wherein the second driving electrode includes at least two sub-driving electrodes that are apart from each other.

14. The method of claim 1, further comprising
supplying a liquid onto the plurality of circular grooves of the first substrate, wherein
the aligning of the plurality of micro-LEDs with the plurality of circular grooves includes aligning the plurality of micro-LEDs with the plurality of circular grooves by scanning the first substrate with an absorber capable of absorbing the liquid.

* * * * *